(12) United States Patent
Carey et al.

(10) Patent No.: US 9,627,230 B2
(45) Date of Patent: Apr. 18, 2017

(54) METHODS OF FORMING A MICROSHIELD ON STANDARD QFN PACKAGE

(75) Inventors: Dan Carey, Kernersville, NC (US); Brian Howard Calhoun, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 783 days.

(21) Appl. No.: 13/036,272

(22) Filed: Feb. 28, 2011

(65) Prior Publication Data

US 2012/0218729 A1 Aug. 30, 2012

(51) Int. Cl.
*H05K 3/30* (2006.01)
*H01L 21/56* (2006.01)
(Continued)

(52) U.S. Cl.
CPC .......... *H01L 21/568* (2013.01); *H01L 21/561* (2013.01); *H01L 23/3107* (2013.01); *H01L 23/49541* (2013.01); *H01L 23/49548* (2013.01); *H01L 23/552* (2013.01); *H01L 24/97* (2013.01); *H01L 24/48* (2013.01);
(Continued)

(58) Field of Classification Search
CPC .............. H01L 21/561; H01L 23/3107; H01L 23/49541; H01L 21/568; H01L 23/49548; H01L 23/552; H01L 24/97; H01L 2924/01013; H01L 2924/01029; H01L 2924/01047; H01L 2924/01079; H01L 2924/01082; H01L 2924/1461; H01L 2924/3025; H01L 2924/01033; H01L 2924/00014; H01L 2924/00; H01L 2224/48091; H01L 2224/48247;
(Continued)

(56) References Cited

U.S. PATENT DOCUMENTS

| | | |
|---|---|---|
| 3,566,190 A | 2/1971 | Huebner et al. |
| 3,907,616 A | 9/1975 | Wiemer et al. |

(Continued)

FOREIGN PATENT DOCUMENTS

| | | |
|---|---|---|
| CN | 1855451 A | 11/2006 |
| EP | 1764834 B1 | 9/2005 |

(Continued)

OTHER PUBLICATIONS

Notice of Allowance for U.S. Appl. No. 13/187,814 mailed Sep. 10, 2012, 8 pages.

(Continued)

*Primary Examiner* — Donghai D Nguyen
(74) *Attorney, Agent, or Firm* — Withrow & Terranova, P.L.L.C.

(57) ABSTRACT

Shielded electronic packages may have metallic lead frames to connect an electromagnetic shield to ground. In one embodiment, a metallic lead frame of the electronic package and a surface of the metallic lead frame defines a component area for attaching an electronic component. The metallic lead frame includes a metallic structure associated with the component area that may have a grounding element for connecting to ground and one or more signal connection elements, such as signal leads, for transmitting input and output signals. The electromagnetic shield connects to the metallic lead frame to safely connect to ground while maintaining the signal connection elements isolated from the shield.

19 Claims, 34 Drawing Sheets

(51) Int. Cl.
*H01L 23/31* (2006.01)
*H01L 23/495* (2006.01)
*H01L 23/552* (2006.01)
*H01L 23/00* (2006.01)

(52) U.S. Cl.
CPC ............ *H01L 2224/48091* (2013.01); *H01L 2224/48247* (2013.01); *H01L 2224/97* (2013.01); *H01L 2924/01013* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/1461* (2013.01); *H01L 2924/181* (2013.01); *H01L 2924/3025* (2013.01); *Y10T 29/49002* (2015.01)

(58) Field of Classification Search
CPC ............ H01L 2224/85; H01L 2224/97; H01L 21/6835; Y10T 29/49002; Y10T 29/49146
USPC .......... 29/827, 832, 841, 412; 257/659, 666, 257/676; 438/112, 113, 123, 124
See application file for complete search history.

(56) References Cited

U.S. PATENT DOCUMENTS

| | | |
|---|---|---|
| 3,907,617 A | 9/1975 | Zwernemann |
| 4,680,676 A | 7/1987 | Petratos et al. |
| 5,329,695 A | 7/1994 | Traskos et al. |
| 5,389,738 A | 2/1995 | Piosenka et al. |
| 5,406,630 A | 4/1995 | Piosenka et al. |
| 5,436,203 A | 7/1995 | Lin |
| 5,459,368 A | 10/1995 | Onishi et al. |
| 5,473,512 A | 12/1995 | Degani et al. |
| 5,623,293 A | 4/1997 | Aoki |
| 5,639,989 A | 6/1997 | Higgins, III |
| 5,646,828 A | 7/1997 | Degani et al. |
| 5,650,659 A | 7/1997 | Mostafazadeh et al. |
| 5,870,289 A | 2/1999 | Tokuda et al. |
| 5,977,626 A | 11/1999 | Wang et al. |
| 6,004,180 A | 12/1999 | Knall et al. |
| 6,011,698 A | 1/2000 | Buehler |
| 6,137,693 A | 10/2000 | Schwiebert et al. |
| 6,150,193 A | 11/2000 | Glenn |
| 6,163,454 A | 12/2000 | Strickler |
| 6,297,957 B1 | 10/2001 | Johnson et al. |
| 6,448,583 B1 | 9/2002 | Yoneda et al. |
| 6,448,793 B1 | 9/2002 | Barratt et al. |
| 6,466,416 B1 | 10/2002 | Honjo et al. |
| 6,538,196 B1 | 3/2003 | MacDonald et al. |
| 6,590,152 B1 | 7/2003 | Horio et al. |
| 6,599,779 B2 | 7/2003 | Shim et al. |
| 6,613,660 B2 | 9/2003 | Kahlert et al. |
| 6,633,073 B2 | 10/2003 | Rezvani |
| 6,657,592 B2 | 12/2003 | Dening et al. |
| 6,707,168 B1 | 3/2004 | Hoffman |
| 6,717,485 B2 | 4/2004 | Kolb et al. |
| 6,791,795 B2 | 9/2004 | Ohtomo et al. |
| 6,807,731 B2 | 10/2004 | Brandenburg et al. |
| 6,825,560 B1 | 11/2004 | Walker |
| 6,838,750 B2 | 1/2005 | Nuytkens et al. |
| 6,887,787 B2 | 5/2005 | Farnworth |
| 6,900,383 B2 | 5/2005 | Babb et al. |
| 6,946,324 B1 | 9/2005 | McLellan et al. |
| 6,947,295 B2 | 9/2005 | Hsieh |
| 6,998,532 B2 | 2/2006 | Kawamoto et al. |
| 7,030,469 B2 | 4/2006 | Mahadevan et al. |
| 7,042,398 B2 | 5/2006 | Tang |
| 7,087,461 B2 | 8/2006 | Park et al. |
| 7,087,462 B1 | 8/2006 | Park et al. |
| 7,109,410 B2 | 9/2006 | Arnold et al. |
| 7,109,817 B2 | 9/2006 | Kolb |
| 7,125,744 B2 | 10/2006 | Takehara et al. |
| 7,148,574 B2 | 12/2006 | Lee et al. |
| 7,187,060 B2 | 3/2007 | Usui |
| 7,227,719 B2 | 6/2007 | Sasaki |
| 7,259,041 B2 | 8/2007 | Stelzl et al. |
| 7,342,303 B1 | 3/2008 | Berry et al. |
| 7,348,663 B1 | 3/2008 | Kirloskar et al. |
| 7,433,203 B1 | 10/2008 | Yi et al. |
| 7,443,693 B2 | 10/2008 | Arnold et al. |
| 7,445,968 B2 | 11/2008 | Harrison et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,514,772 B2 | 4/2009 | Kobayashi et al. |
| 7,548,430 B1 | 6/2009 | Huemoeller et al. |
| 7,598,606 B2 | 10/2009 | Chow et al. |
| 7,633,170 B2 | 12/2009 | Yang et al. |
| 7,633,765 B1 | 12/2009 | Scanlan et al. |
| 7,635,918 B2 | 12/2009 | Yoshida |
| 7,636,245 B2 | 12/2009 | Clancy et al. |
| 7,643,311 B2 | 1/2010 | Coffy |
| 7,651,889 B2 | 1/2010 | Tang et al. |
| 7,665,201 B2 | 2/2010 | Sjoedin |
| 7,671,451 B2 | 3/2010 | Lee et al. |
| 7,700,411 B2 | 4/2010 | Yang et al. |
| 7,701,728 B2 | 4/2010 | Hatanaka et al. |
| 7,772,046 B2 | 8/2010 | Pagaila et al. |
| 7,829,981 B2 | 11/2010 | Hsu |
| 7,902,643 B2 | 3/2011 | Tuttle |
| 7,902,644 B2 * | 3/2011 | Huang ................ H01L 21/6835 257/659 |
| 7,928,538 B2 | 4/2011 | Salzman |
| 7,960,818 B1 * | 6/2011 | Davis et al. ................... 257/676 |
| 8,013,258 B2 | 9/2011 | Wu |
| 8,084,300 B1 | 12/2011 | San Antonio et al. |
| 8,093,690 B2 | 1/2012 | Ko et al. |
| 8,110,441 B2 | 2/2012 | Chandra et al. |
| 8,220,145 B2 | 7/2012 | Hiner et al. |
| 8,268,677 B1 | 9/2012 | Pagaila |
| 8,373,264 B2 | 2/2013 | Welch et al. |
| 8,434,220 B2 | 5/2013 | Rao et al. |
| 8,507,319 B2 * | 8/2013 | Chow ................ H01L 23/3107 257/659 |
| 8,614,899 B2 | 12/2013 | Madsen et al. |
| 8,748,230 B2 | 6/2014 | Welch et al. |
| 8,861,221 B2 | 10/2014 | Pagaila |
| 2002/0036345 A1 | 3/2002 | Iseki et al. |
| 2002/0118529 A1 | 8/2002 | Babin |
| 2002/0142516 A1 | 10/2002 | Light |
| 2003/0011049 A1 | 1/2003 | Nuytkens et al. |
| 2003/0048581 A1 | 3/2003 | Ohtomo et al. |
| 2003/0062541 A1 | 4/2003 | Warner |
| 2003/0151122 A1 | 8/2003 | Davies |
| 2004/0063246 A1 | 4/2004 | Karnezos |
| 2004/0103509 A1 | 6/2004 | Bidard |
| 2004/0104473 A1 | 6/2004 | Farnworth |
| 2004/0178500 A1 | 9/2004 | Usui |
| 2004/0209434 A1 | 10/2004 | Seaford et al. |
| 2004/0214023 A1 | 10/2004 | Park et al. |
| 2004/0222511 A1 | 11/2004 | Zhang |
| 2004/0232536 A1 | 11/2004 | Fukuzumi |
| 2004/0238934 A1 | 12/2004 | Warner et al. |
| 2005/0046001 A1 | 3/2005 | Warner |
| 2005/0153061 A1 | 7/2005 | Nuytkens et al. |
| 2006/0033184 A1 | 2/2006 | Park et al. |
| 2006/0151203 A1 | 7/2006 | Krueger et al. |
| 2006/0223577 A1 | 10/2006 | Ouzillou |
| 2006/0244131 A1 | 11/2006 | Kobayashi et al. |
| 2006/0273813 A1 | 12/2006 | Coffy |
| 2006/0274517 A1 | 12/2006 | Coffy |
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0155053 A1 | 7/2007 | Karnezos |
| 2007/0163802 A1 | 7/2007 | Monthei |
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |

(56) References Cited

U.S. PATENT DOCUMENTS

| | | |
|---|---|---|
| 2008/0019112 A1 | 1/2008 | Hatanaka et al. |
| 2008/0054421 A1 | 3/2008 | Dimaano |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1 | 1/2009 | Mori et al. |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1 | 3/2010 | Lam |
| 2010/0123233 A1 | 5/2010 | Yoon et al. |
| 2010/0199492 A1 | 8/2010 | Hiner et al. |
| 2010/0207258 A1 | 8/2010 | Eun et al. |
| 2010/0224992 A1 | 9/2010 | McConnelee et al. |
| 2010/0279730 A1 | 11/2010 | Ortiz |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0225803 A1 | 9/2011 | Hiner et al. |
| 2011/0235282 A1 | 9/2011 | Leahy et al. |
| 2011/0298109 A1 | 12/2011 | Pagaila et al. |
| 2011/0298670 A1 | 12/2011 | Jung et al. |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1* | 5/2012 | San Antonio et al. ....... 257/659 |
| 2012/0182706 A1 | 7/2012 | Siomkos et al. |
| 2012/0217624 A1 | 8/2012 | Morris et al. |
| 2012/0270371 A1 | 10/2012 | Debar et al. |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2014/0355222 A1 | 12/2014 | Dang et al. |
| 2015/0091157 A9 | 4/2015 | Chi et al. |
| 2015/0124421 A1 | 5/2015 | Leahy et al. |

FOREIGN PATENT DOCUMENTS

| | | |
|---|---|---|
| EP | 1715520 A1 | 10/2006 |
| EP | 1717857 A2 | 11/2006 |
| JP | 11-163583 | 6/1999 |
| JP | 2004207352 A | 7/2004 |
| JP | 2005039007 A | 2/2005 |
| JP | 2005109306 A | 4/2005 |
| JP | 2006310629 A | 11/2006 |
| JP | 2006332255 A | 12/2006 |
| JP | 2007311396 A | 11/2007 |
| KR | 20060113412 A | 11/2006 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009144960 A1 | 12/2009 |
| WO | 2010014103 A1 | 2/2010 |
| WO | 2010021262 A1 | 2/2010 |

OTHER PUBLICATIONS

Notice of Allowance for U.S. Appl. No. 13/117,284 mailed May 1, 2012, 15 pages.
Non-final Office Action for U.S. Appl. No. 11/952,592 mailed Jun. 12, 2012, 28 pages.
Notice of Allowance for U.S. Appl. No. 11/952,617 mailed Jun. 4, 2012, 24 pages.
Notice of Allowance for U.S. Appl. No. 12/913,364 mailed Jun. 8, 2012, 12 pages.
Non-Final Office Action for U.S. Appl. No. 13/034,755, mailed Aug. 15, 2013, 6 pages.
Non-Final Office Action for U.S. Appl. No. 13/034,787, mailed Aug. 9, 2013, 9 pages.
Advisory Action for U.S. Appl. No. 12/797,381, mailed Jul. 17, 2013, 3 pages.
Quayle Action for U.S. Appl. No. 13/415,643, mailed Jul. 11, 2013, 6 pages.
Notice of Allowance for U.S. Appl. No. 13/415,643, mailed Aug. 15, 2013, 8 pages.
Final Office Action for U.S. Appl. No. 11/952,592 mailed Jan. 18, 2012, 10 pages.
Non-Final Rejection for U.S. Appl. No. 12/913,364 mailed Feb. 13, 2012, 32 pages.
Final Office Action for U.S. Appl. No. 11/952,617 mailed Feb. 16, 2012, 15 pages.
Notice of Allowance for U.S. Appl. No. 11/952,513 mailed Mar. 6, 2012, 16 pages.
Second Office Action for Chinese patent application 200880104171.1 mailed Feb. 16, 2012, 14 pages.
Final Office Action for U.S. Appl. No. 13/117,284 mailed Feb. 29, 2012, 8 pages.
Notice of Allowance mailed Oct. 2, 2008 for U.S. Appl. No. 11/199,319, now U.S. Pat. No. 7,451,539.
Requirement for Restriction/Election mailed Mar. 26, 2008 for U.S. Appl. No. 11/199,319, now U.S. Pat. No. 7,451,539.
Non-Final Rejection mailed May 21, 2010 for U.S. Appl. No. 11/435,913.
Final Rejection mailed Nov. 17, 2009 for U.S. Appl. No. 11/435,913.
Non-Final Rejection mailed Mar. 2, 2009 for U.S. Appl. No. 11/435,913.
Final Rejection mailed Aug. 15, 2008 for U.S. Appl. No. 11/435,913.
Non-Final Rejection mailed Jan. 7, 2008 for U.S. Appl. No. 11/435,913.
Requirement for Restriction/Election mailed Oct. 10, 2007 for U.S. Appl. No. 11/435,913.
Non-Final Rejection mailed Jan. 21, 2009 for U.S. Appl. No. 11/768,014.
Non-Final Rejection mailed Mar. 25, 2010 for U.S. Appl. No. 11/768,014.
Non-Final Rejection mailed Jul. 10, 2009 for U.S. Appl. No. 11/768,014.
Requirement for Restriction/Election mailed Sep. 29, 2008 for U.S. Appl. No. 11/768,014.
Non-Final Rejection mailed Jan. 8, 2010 for U.S. Appl. No. 11/952,484.
Final Rejection mailed Oct. 5, 2010 for U.S. Appl. No. 11/952,484.
Requirement for Restriction/Election mailed Sep. 11, 2009 for U.S. Appl. No. 11/952,484.

(56) References Cited

OTHER PUBLICATIONS

Non-Final Rejection mailed May 10, 2011 for U.S. Appl. No. 11/952,513.
Non-Final Rejection mailed Oct. 23, 2009 for U.S. Appl. No. 11/952,545.
Requirement for Restriction/Election mailed May 21, 2009 for U.S. Appl. No. 11/952,545.
Final Rejection mailed Feb. 24, 2011 for U.S. Appl. No. 11/952,592.
Non-Final Rejection mailed Dec. 15, 2010 for U.S. Appl. No. 11/952,592.
Non-Final Rejection mailed Jul. 28, 2009 for U.S. Appl. No. 11/952,592.
Final Rejection mailed Apr. 16, 2010 for U.S. Appl. No. 11/952,592.
Requirement for Restriction/Election mailed Jan. 26, 2009 for U.S. Appl. No. 11/952,592.
Requirement for Restriction/Election mailed Apr. 14, 2009 for U.S. Appl. No. 11/952,592.
Non-Final Rejection mailed Sep. 26, 2008 for U.S. Appl. No. 11/952,617.
Final Rejection mailed Nov. 20, 2009 for U.S. Appl. No. 11/952,617.
Requirement for Restriction/Election mailed Apr. 27, 2009 for U.S. Appl. No. 11/952,617.
Non-Final Rejection mailed Jun. 13, 2011 for U.S. Appl. No. 11/952,634.
Notice of Allowance mailed Mar. 3, 2011 for U.S. Appl. No. 11/952,634.
Final Rejection mailed Dec. 23, 2010 for U.S. Appl. No. 11/952,634.
Nonfinal Rejection mailed Jul. 21, 2010 for U.S. Appl. No. 11/952,634.
Requirement for Restriction/Election mailed May 12, 2010 for U.S. Appl. No. 11/952,634.
Non-Final Rejection mailed Jun. 22, 2011 for U.S. Appl. No. 11/952,670.
Non-Final Rejection mailed May 27, 2010 for U.S. Appl. No. 11/952,670.
Requirement for Restriction/Election mailed Jul. 22, 2009 for U.S. Appl. No. 11/952,670.
Supplemental Notice of Allowability mailed Oct. 12, 2010 for U.S. Appl. No. 11/952,690.
Supplemental Notice of Allowability mailed Sep. 27, 2010 for U.S. Appl. No. 11/952,690.
Notice of Allowance mailed Aug. 30, 2010 for U.S. Appl. No. 11/952,690.
Non-Final Rejection mailed Mar. 25, 2010 for U.S. Appl. No. 11/952,690.
Chomerics, "Cho-Shield Conductive Coatings," Web page copyright 2001, Chomerics, A Division of Parker Hannifin Corporation, Retrieved from http://www.chomerics.com/products/choshield_coatings.htm.
Chomerics, "Cho-Shield Conductive Coatings," Last modified Dec. 8, 2000, Chomerics, A Division of Parker Hannifin Corporation. http://www.chomerics.com/products/choshield_coatings.htm.
International Search Report for PCT/US2008/068153, mailed Dec. 9, 2008.
RF Micro Devices, Inc., "Fractional-N RF Synthesizer With Modulator and Digital IF Filter," RF6001, Rev A2, May 6, 2002, 2 pages.
Final Office Action for U.S. Appl. No. 11/952,513 mailed Oct. 26, 2011, 16 pages.
Non-final Office Action for U.S. Appl. No. 13/117,284 mailed Nov. 9, 2011, 12 pages.
Non-final Office Action for U.S. Appl. No. 11/952,592 mailed Sep. 19, 2011, 9 pages.
Non-final Office Action for U.S. Appl. No. 11/952,617 mailed Jul. 28, 2011, 9 pages.
Final Office Action for U.S. Appl. No. 11/952,634 mailed Feb. 1, 2011, 7 pages.
Notice of Allowance for U.S. Appl. No. 11/952,670 mailed Oct. 21, 2009, 24 pages.
Office Action for Chinese patent application 200880104171.1 mailed Jun. 2, 2011, 20 pages.
Non-final Office Action for U.S. Appl. No. 11/952,484 mailed Oct. 27, 2011, 22 pages.
Notice of Allowance for U.S. Appl. No. 13/151,499, mailed Dec. 19, 2013, 8 pages.
Final Office Action for U.S. Appl. No. 13/034,787, mailed Nov. 15, 2013, 12 pages.
Examiner's Answer for U.S. Appl. No. 12/797,381, mailed Dec. 31, 2013, 6 pages.
Final Office Action for U.S. Appl. No. 13/034,787, mailed Mar. 19, 2013, 9 pages.
Final Office Action for U.S. Appl. No. 12/797,381, mailed May 16, 2013, 19 pages.
Advisory Action for U.S. Appl. No. 13/034,787, mailed May 17, 2013, 3 pages.
Non-final Office Action for U.S. Appl. No. 12/766,347 mailed Jun. 29, 2012, 11 pages.
Notice of Allowance for U.S. Appl. No. 11/952,592 mailed Aug. 6, 2012, 7 pages.
Notice of Allowance for U.S. Appl. No. 11/952,670 mailed Aug. 24, 2012, 7 pages.
Advisory Action for U.S. Appl. No. 13/034,787, mailed Jan. 27, 2014, 4 pages.
Final Office Action for U.S. Appl. No. 13/034,755, mailed Jan. 31, 2014, 10 pages.
Advisory Action for U.S. Appl. No. 13/034,787, mailed Feb. 26, 2014, 4 pages.
Advisory Action for U.S. Appl. No. 13/034,755, mailed Mar. 4, 2014, 3 pages.
Non-Final Office Action for U.S. Appl. No. 13/189,838, mailed Mar. 14, 2014, 14 pages.
Notice of Allowance for U.S. Appl. No. 11/952,617 mailed Jan. 8, 2013, 8 pages.
Non-final Office Action for U.S. Appl. No. 13/034,787 mailed Jan. 16, 2013, 9 pages.
Non-final Office Action for U.S. Appl. No. 12/797,381 mailed Jan. 8, 2013, 20 pages.
Non-final Office Action for U.S. Appl. No. 13/415,643 mailed Jan. 3, 2013, 17 pages.
Corrected Notice of Allowability for U.S. Appl. No. 13/034,787, mailed Jul. 29, 2014, 5 pages.
Notice of Allowance for U.S. Appl. No. 13/034,787, mailed May 1, 2014, 9 pages.
Final Office Action for U.S. Appl. No. 13/189,838, mailed Jun. 19, 2014, 10 pages.
Notice of Allowance for U.S. Appl. No. 13/034,755, mailed Oct. 17, 2014, 7 pages.
Advisory Action for U.S. Appl. No. 13/189,838, mailed Aug. 28, 2014, 2 pages.
Non-Final Office Action for U.S. Appl. No. 13/189,838, mailed Oct. 28, 2014, 11 pages.
Notice of Allowance for U.S. Appl. No. 13/189,838, mailed May 4, 2015, 8 pages.
Non-Final Office Action for U.S. Appl. No. 14/447,847, mailed May 7, 2015, 7 pages.
Final Office Action for U.S. Appl. No. 13/189,838, mailed Feb. 20, 2015, 13 pages.
Notice of Allowance for U.S. Appl. No. 13/189,838, mailed Jul. 30, 2015, 5 pages.
Final Office Action for U.S. Appl. No. 14/447,847, mailed Sep. 14, 2015, 8 pages.
Non-Final Office Action for U.S. Appl. No. 13/906,892, mailed Aug. 10, 2015, 10 pages.
Final Office Action for U.S. Appl. No. 14/447,847, mailed Dec. 11, 2015, 8 pages.
Final Office Action for U.S. Appl. No. 13/906,892, mailed Feb. 11, 2016, 10 pages.
Corrected Notice of Allowability for US. Appl. No. 14/447,847, mailed Jul. 15, 2016, 4 pages.
Advisory Action for U.S. Appl. No. 13/906,892, mailed Jun. 15, 2016, 2 pages.

(56) References Cited

OTHER PUBLICATIONS

Non-Final Office Action for U.S. Appl. No. 14/595,401, mailed Mar. 28, 2016, 14 pages.
Decision on Appeal for U.S. Appl. No. 12/797,381, mailed Mar. 11, 2016, 6 pages.
Notice of Allowance for U.S. Appl. No. 14/447,847, mailed Feb. 29, 2016, 7 pages.
Notice of Allowance for U.S. Appl. No. 14/447,847, mailed Mar. 31, 2016, 7 pages.
Final Office Action for U.S. Appl. No. 14/595,401, mailed Oct. 6, 2016, 15 pages.
Final Office Action for U.S. Appl. No. 13/906,892, mailed Aug. 26, 2016, 11 pages.
Advisory Action for U.S. Appl. No. 13/906,892, mailed Nov. 28, 2016, 3 pages.
Final Office Action for U.S. Appl. No. 13/906,892, mailed Dec. 15, 2016, 11 pages.
Notice of Allowance for U.S. Appl. No. 14/595,401, mailed Jan. 6, 2017, 8 pages.

\* cited by examiner

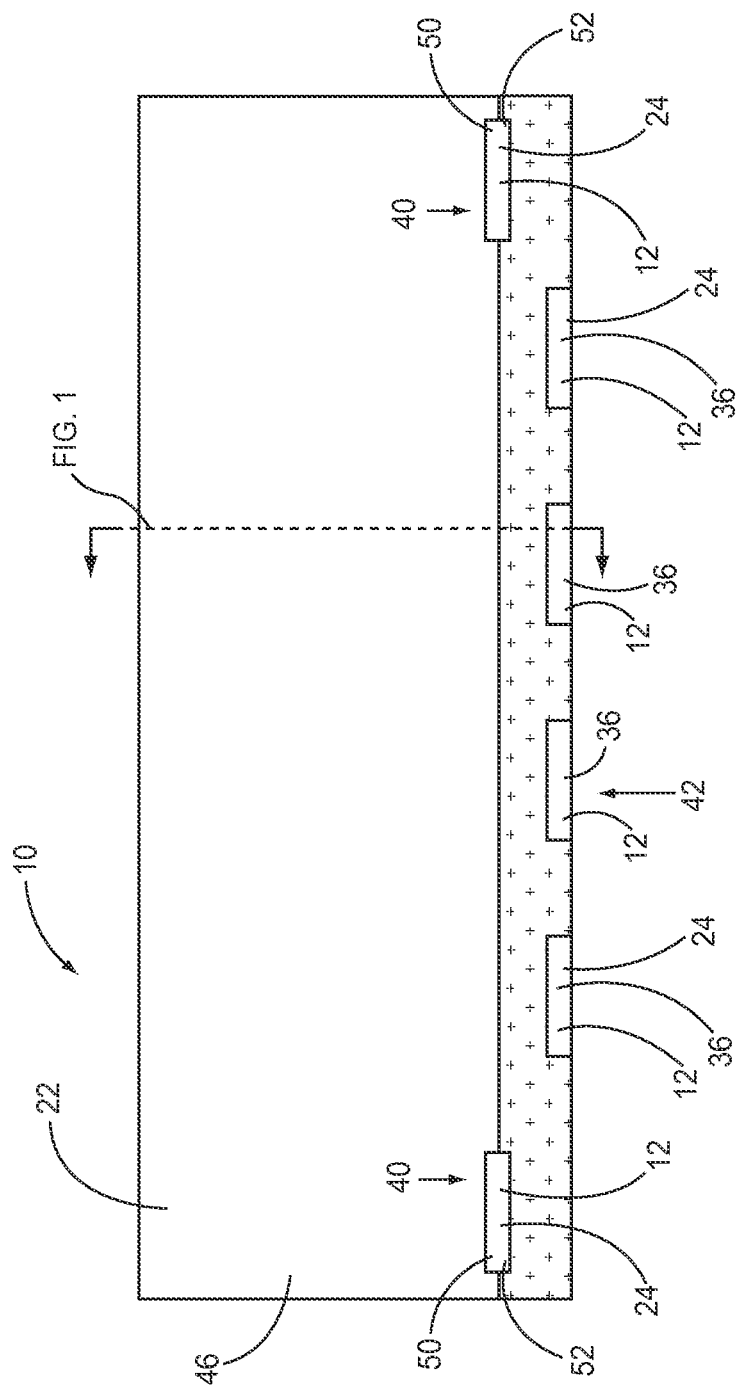

US 9,627,230 B2

METHODS OF FORMING A MICROSHIELD ON STANDARD QFN PACKAGE

FIELD OF THE DISCLOSURE

The present disclosure relates to electronic packages having electromagnetic shields and methods of manufacturing the same.

BACKGROUND

Electronic components have become ubiquitous in modern society. The electronics industry routinely announces accelerated clocking speeds, higher transmission frequencies, and smaller integrated circuit modules. While the benefits of these devices are myriad, smaller electronic components that operate at higher frequencies also create problems. Higher operating frequencies mean shorter wavelengths, where shorter conductive elements within electronic circuitry may act as antennas to unintentionally broadcast electromagnetic emissions throughout the electromagnetic spectrum. If the signal strengths of the emissions are high enough, the emissions may interfere with the operation of an electronic component subjected to the emissions. Further, the Federal Communications Commission (FCC) and other regulatory agencies regulate these emissions, and as such, these emissions must be kept within regulatory requirements.

One way to reduce emissions is to form a shield around the electronic modules that support the electronic components. Typically, a shield is formed from a grounded conductive structure that covers a module or a portion thereof. When emissions from electronic components within the shield strike the interior surface of the shield, the electromagnetic emissions are electrically shorted through the grounded conductive structure that forms the shield, thereby reducing emissions. Likewise, when external emissions from outside the shield strike the exterior surface of the shield, a similar electrical short occurs, and the electronic components in the module do not experience the emissions.

However, electronic component are often provided in electronic packages for printed circuit boards, such as Quad Flat No Lead ("QFN"), Micro-Lead Frame ("MLF"), Chip Support Package ("CSP"), Ball Grid Array ("BOA") packages, and the like. Due to the small size of these electronic packages, it is difficult to cover the electronic package with an electromagnetic shield and still couple the electromagnetic shield to ground. The small size of the electronic packages also makes maintaining the electromagnetic shield isolated from the signal leads of the electronic package difficult. Thus, an electronic package is needed having an electromagnetic shield that is easily coupled to ground and is isolated from the signal leads in the electronic package.

SUMMARY

The present disclosure may be used to form one or more electronic packages having an electromagnetic shield. In one embodiment, a metallic lead frame of the electronic package and a surface of the metallic lead frame defines a component area for attaching an electronic component. The metallic lead frame includes a metallic structure associated with the component area that may have a grounding element for connecting to ground and one or more signal connection elements, such as signal leads, for transmitting input and output signals.

An overmold is provided within and over the metallic lead frame, which covers the component area. So that an electromagnetic shield may be coupled to ground, an opening is formed through the overmold that exposes at least a section of the metallic structure. For example, the opening may expose a section of the grounding element. To form the electromagnetic shield over the component area, an electromagnetic shield material is applied within the opening and over the overmold. This electromagnetic shield couples to the exposed section of the metallic structure, for example the exposed section of the grounding element, to connect the electromagnetic shield to ground. Furthermore, the signal connection elements may be etched so that the signal connection elements remain unexposed by the opening and thus are isolated from the electromagnetic shield.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2 is another cross-sectional view illustrating the electronic package shown in FIG. 1.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims. Also, it should be noted that if a component(s) in the Figures has a multiplicity of the same element, not all of the multiplicity may be labeled with a number but rather one or some of multiplicity may be numbered for the sake of clarity.

Figure 1:
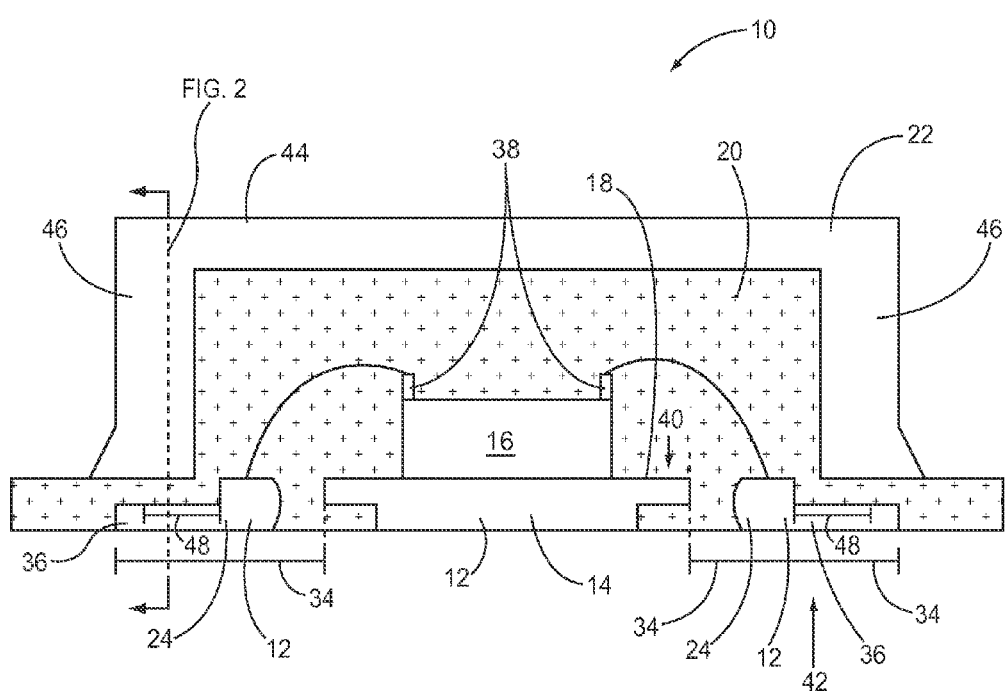
FIG. 1 is a cross-sectional view of one embodiment of an electronic package in accordance with this disclosure.

The present disclosure relates to electronic packages having electromagnetic shields and methods of manufacturing the same. The electronic packages may be any type of electronic package, such as QFN packages, MLF packages, CSP packages, BGA packages, or the like. FIG. 1 illustrates one embodiment of an electronic package 10 in accordance with this disclosure. The electronic package 10 may be formed on a metallic lead frame 12. The metallic lead frame 12 may be made from any metallic material utilized in electronic packages, such as copper (Cu), aluminum (Al), Silver (Ag), or gold (Au), or the like.

The metallic lead frame 12 has a component portion 14 that supports an electronic component 16. The electronic component is attached on a component area 18 of the component portion 14. The electronic component 16 may be any type of electronic component. For example, electronic component 16 may be an electronic circuit built on its own semiconductor substrate, such as a processor, volatile memory, non-volatile memory, a radio frequency circuit, or a micro-mechanical system (MEMS) device. Electronic components 16 may also be electrical devices such as filters, capacitors, inductors, and resistors or electronic circuits having any combination of these electronic devices. In the illustrated embodiment, the metallic lead frame 12 has a single a single component portion 14 with a single electronic component 16. However, in other embodiments, the metallic lead frame 12 may include a plurality of component portions 14. Also, the component portion 14 may have a plurality of electronic components 16 on the component area 18.

An overmold 20 is provided within and over the metallic lead frame 12 to cover the component area 18. The overmold 20 may be provided within the metallic lead frame 12 to provide integrity to the metallic lead frame 12, as some or all of the components of the metallic lead frame 12 may not be attached to one another by the metallic lead frame 12 itself. In this manner, the metallic lead frame 12 may form a base for supporting the components of the electronic package 10. By providing the overmold 20 over the metallic lead frame 12 to cover the component area 18, the overmold 20 may support an electromagnetic shield 22, which in this example is a conformal electromagnetic shield 22 that conforms to the shape of the overmold 20. Also, the overmold may be made from an insulating or dielectric material, such as $SiO_x$, that helps to electromagnetically isolate the electronic component 16.

The metallic lead frame 12 may also have a metallic structure 24 associated with the component area 18. In this embodiment, the metallic structure 24 extends along a periphery 34 of the component portion 14. The periphery 34 of the component portion 14 may be defined as the volume in the metallic lead frame 12 surrounding the boundary of the component portion 14 but being within the metallic lead frame 12. Furthermore, the metallic structure 24, components of the metallic structure 24, and other features associated with this disclosure may extend, be positioned, or may be made along or about the periphery 34 by being within, adjacent to, or near, the periphery 34 of the component portion 14. In some embodiments, the metallic structure 24 extends about only a portion of the periphery 34. However, as shall be explained in further detail below, the metallic structure 24 in this embodiment extends about substantially the entire periphery 34 of the component portion 14.

The metallic structure 24 includes a plurality of signal connection elements 36 for transmitting signals to and/or from the electronic component 16. Signal connection elements 36 may be any type of structure for transmitting signals. In this embodiment, signal connection elements 36 are signal leads 36 for the electronic package 10. The electronic component 16 includes terminals 38 which are wire bonded to the signal leads 36 for transmitting signals to and/or from the electronic component 16.

As illustrated in FIG. 1, the metallic structure 12 defines a first side 40 and a second side 42 oppositely disposed from the first side 40. The first side 40 includes the surface of the metallic lead frame 12 that has the component area 18. Also, the electromagnetic shield 22 has a top portion 44 and lateral portions 46. The lateral portions 46 extend downwards to couple the electromagnetic shield 22 to ground. However, as shown in FIG. 1, a section 48 of each of the signal leads 36 has been partially etched on the first side 40 of the metallic lead frame 12. As a result, the sections 48 of each of the signal leads 36 are not exposed through the overmold 20 from the first side 40 of the metallic lead frame 12 and thus the signal leads 36 remain isolated from the electromagnetic shield 22. Accordingly, even though the lateral portions 46 of the electromagnetic shield 22 are directly above the sections 48 of the signal leads 36, the signal leads 36 are not shorted through the electromagnetic shield 22.

FIG. 2 illustrates a cross section of one side of electronic package 10. As illustrated in FIG. 2, the lateral portion 46 of the electromagnetic shield 22 extends onto the first side 40 of the metallic lead frame 12. The lateral portions 46 of the electromagnetic shield 22 attach to grounding elements 50 for connecting to ground. The grounding elements 50 may be any type of structure for connecting to ground. As shall be explained in further detail below, the grounding elements 50 in this embodiment are grounding portions 52 of the metallic structure 24.

Figure 3A:
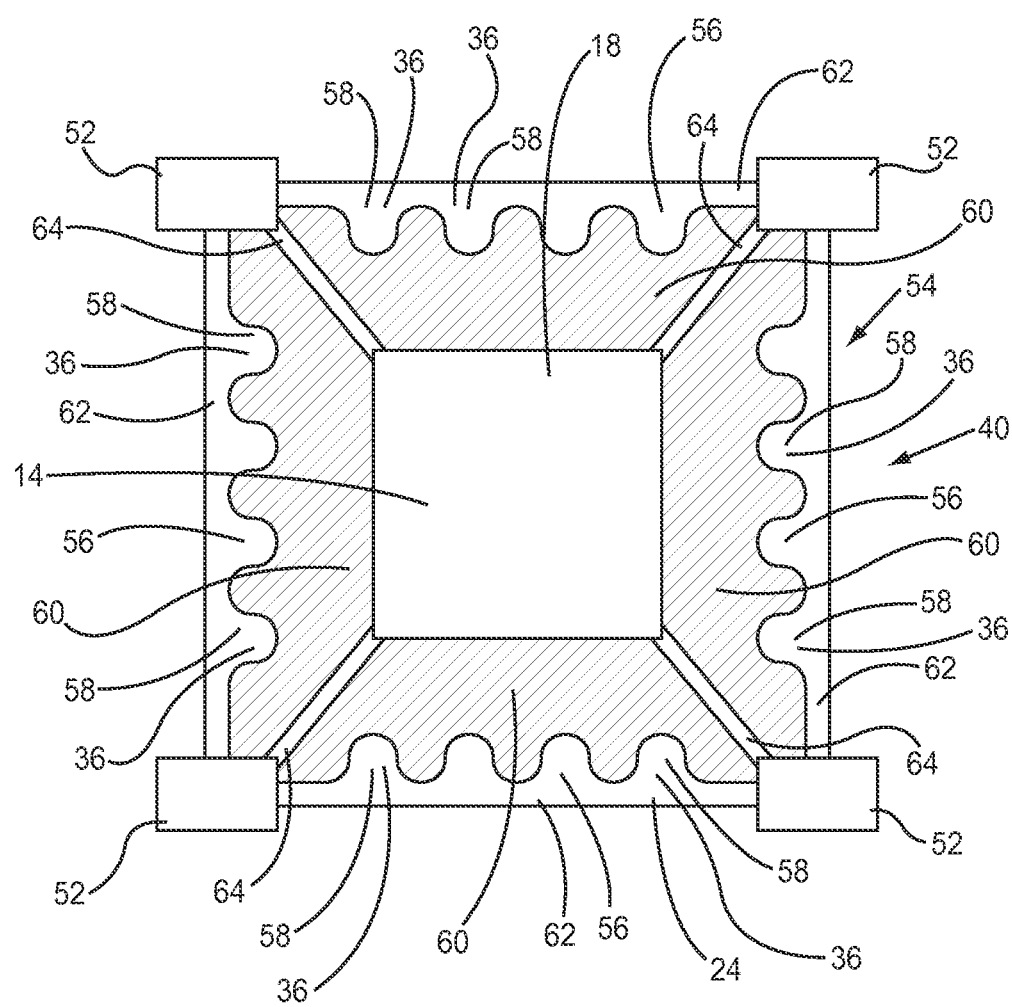
FIGS. 3A-3L illustrates one embodiment of steps for manufacturing the electronic package illustrated in FIG. 1.

FIGS. 3A-3L illustrates one embodiment of steps for forming the electronic package 10 discussed in FIGS. 1 and 2. It should be noted that the steps illustrated in FIGS. 3A-3L, as well as other steps discussed in this disclosure, are examples and alternative, different, or additional steps may be utilized to form the electronic package 10. In FIG. 3A, the metallic lead frame 12 for the electronic package 10 is provided. The metallic lead frame 12 is illustrated from the first side 40 of the metallic lead frame 12. The surface 54 on the first side 40 of the metallic lead frame 12 has the component area 18 on the component portion 14. The metallic structure 24 in this embodiment surrounds the entire periphery 34 of the component portion 14. In alternative embodiments, the metallic structure 24 may extend along only a portion of the component portion 14.

The metallic structure 24 includes a plurality of connection portions 56. In this embodiment, the connection portions 56 each include four (4) connection leads 58. However, in alternative embodiments, the connection portions 56 may include any number of connection leads 58, in accordance with the design of the electronic package 10. All of the connection leads 58 of the electronic package 10 may be signal leads 36 utilized for transmitting signals, as discussed above. As illustrated by FIG. 3A, gaps 60 separate the component portion 14 from the connection portions 56. To maintain the integrity of the metallic lead frame 12 prior to the application of the overmold 20 (shown in FIG. 1), the signal leads 36 are each attached to a tie bar 62. These tie bars 62 may subsequently be removed or segmented depending on the requirements of the electronic package 10. It should be noted that after tie bars 62 are removed, the metallic structure 24 may not surround the entire periphery 34 of the component portion 14 since small gaps may be created between the signal leads 36 or other parts of the metallic structure 24 when the tie bars 62 are removed. Thus, while not fully surrounding the periphery 34 of the component portion 14, the metallic structure 24 of the illustrated embodiment would still substantially surround the periphery 34.

The metallic structure 24 also has a plurality of grounding portions 52 for coupling the electromagnetic shield 22 (shown in FIG. 1) to ground. Tie bars 64 may be provided to attach the metallic structure 24 to the component portion 14. These tie bars 64 also electrically couple the grounding portions 52 to the component portion 14. The component portion 14 may be configured to directly connect to ground when the electronic package 10 is connected to external components. Thus, tie bars 64 may provide a path to ground for the grounding portions 52 through the component portion 14.

Figure 3B:
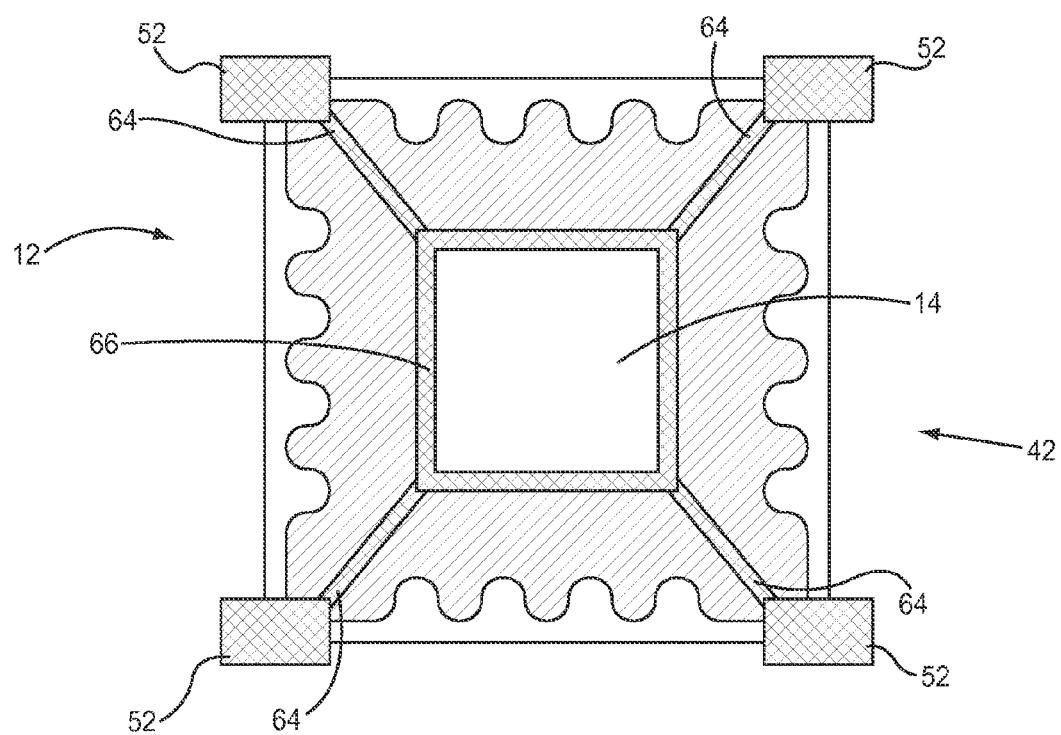
Figure 3C:
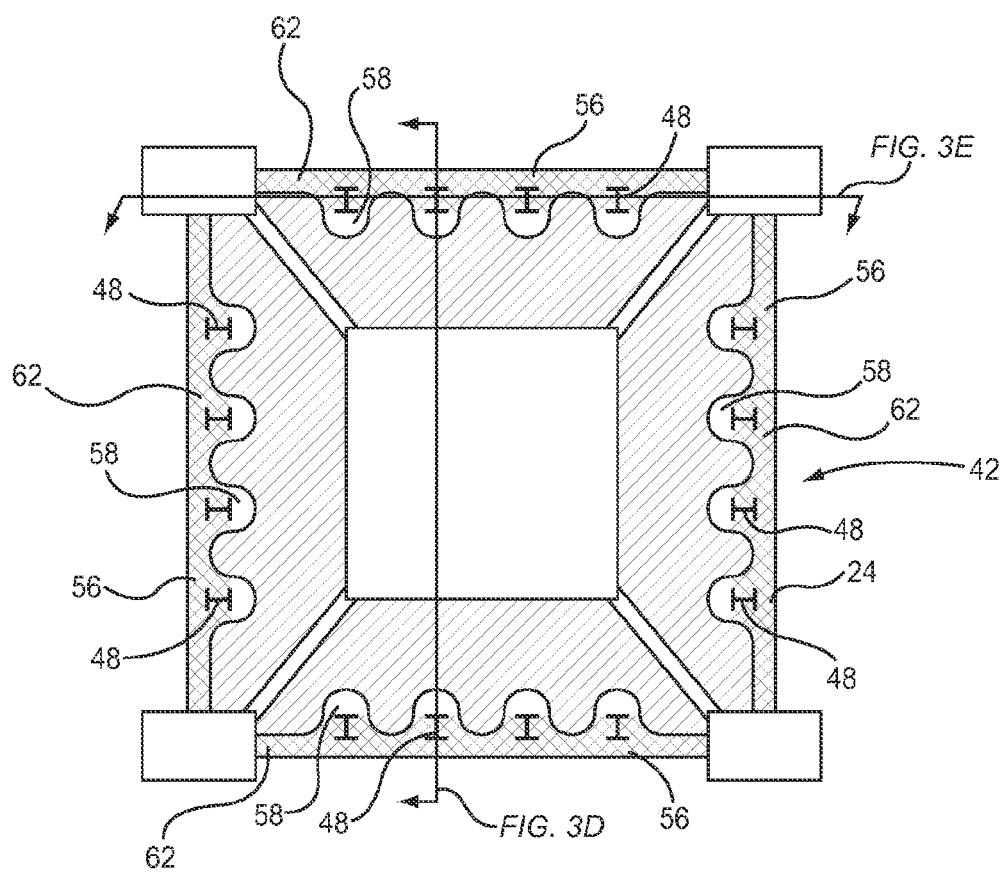

Next, a first partial etch is performed from the second side 42 of the metallic lead frame 12 on the grounding portions 52, sections 66 of the component portion 14, and the tie bars 64 (FIG. 3B). A second partial etch may then be performed on the connection portions 56 of the metallic structure 24 from the first side 40 of the metallic lead frame 12 (FIG. 3C). The second partial etch etches the sections 48 of the signal leads 36 and tie bars 62. In alternative embodiments, the first partial etch may etch only a section of the grounding portions 52 and/or the second partial etch may partially etch the entirety of the signal leads 36 from the first side 40. Also, there is no requirement that the first and second partial etches be performed in any particular order.

Figure 3D:
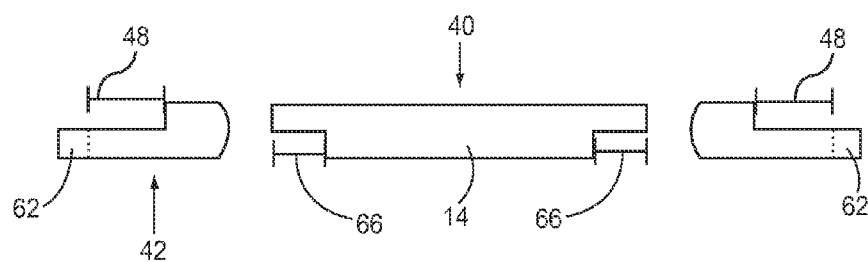
Figure 3E:
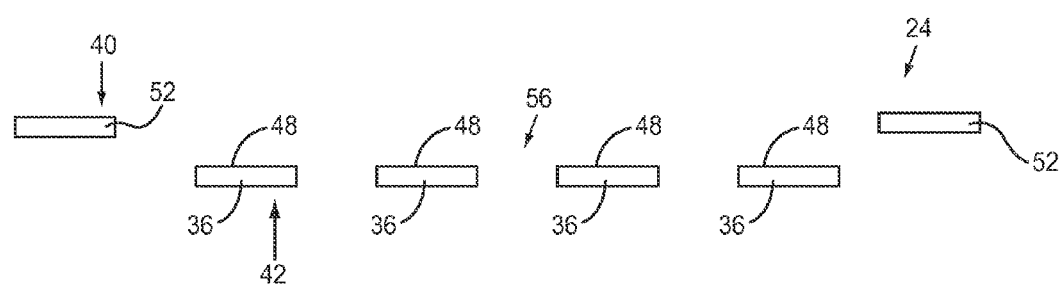

As illustrated in FIGS. 3D and 3E, the first partial etch forms sections 66 of the component portion 14 so that sections 66 are partially etched on the second side 42. The tie bars 64 (shown in 3B) are also partially etched on the second side 42. Similarly, the sections 48 of the signal leads 36 are partially etched on the first side 40. FIG. 3E illustrates a cross-sectional view of the signal leads 36 of one of the connection portions 56 along with the associated grounding portions 52 of the metallic structure 24. By providing the first partial etch and the second partial etch, the sections 48 of the signal leads 36 and the grounding portions 52 are on different vertical levels relative to the first side 40 and the second side 42. In this manner, when the electromagnetic shield 22 (shown in FIG. 1) is formed, the electromagnetic shield 22 may couple to the grounding portions 52 for connecting to ground while remaining isolated from the signal leads 36. Note that to form the electronic package 10, the first partial etch and the second partial etch described in FIGS. 3D and 3E may be performed in-house or by ordering the metallic lead frame 12 with the etching through specifications provided to an outside manufacturer.

Figure 3F:
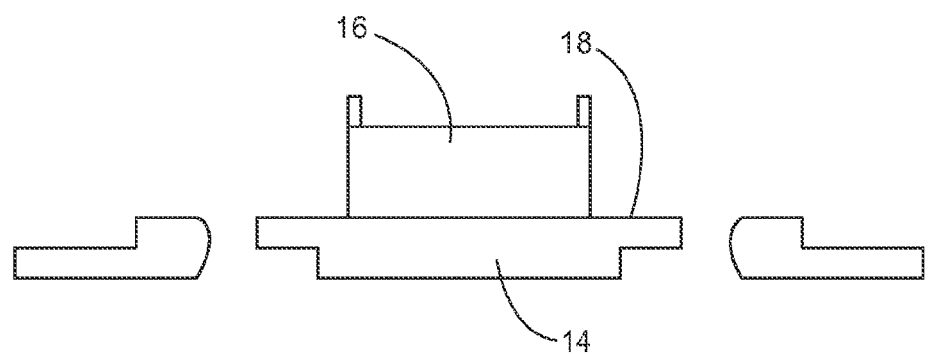
Figure 3G:
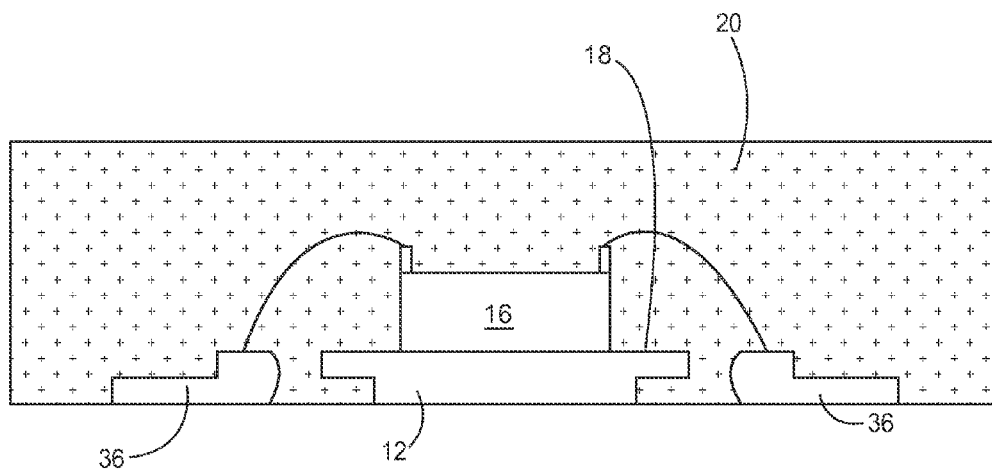
Figure 3H:
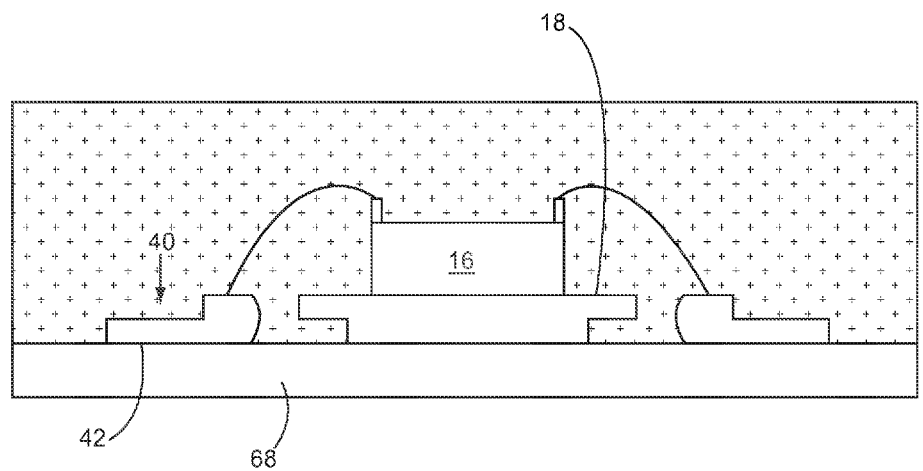
Figure 3I:
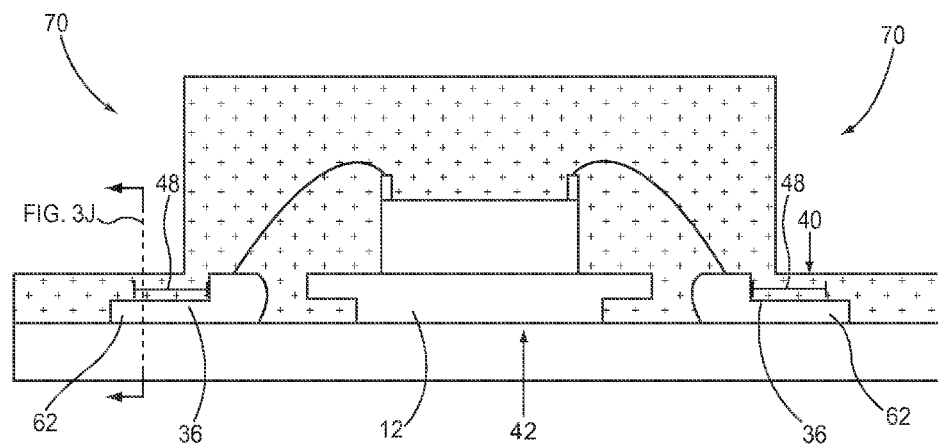

The electronic component 16 may then be attached to the component area 18 of the component portion 14 (FIG. 3F). The electronic component 16 is wire bonded to signal leads 36 and the overmold 20 is applied within and over the metallic lead frame 12 to cover the component area 18 (FIG. 3G). Prior to forming the electromagnetic shield 22 (shown in FIG. 1) over the component area 18, a protective covering 68 may be provided to protect the second side 42 from an electromagnetic shield material (FIG. 3H). The protective covering 68 may for example be made from tape, or the like. An opening 70 may then be formed through the overmold 20 (FIG. 3I). The opening 70 may be formed by cutting into the overmold 20 utilizing a grinding process, or the like.

Figure 3J:
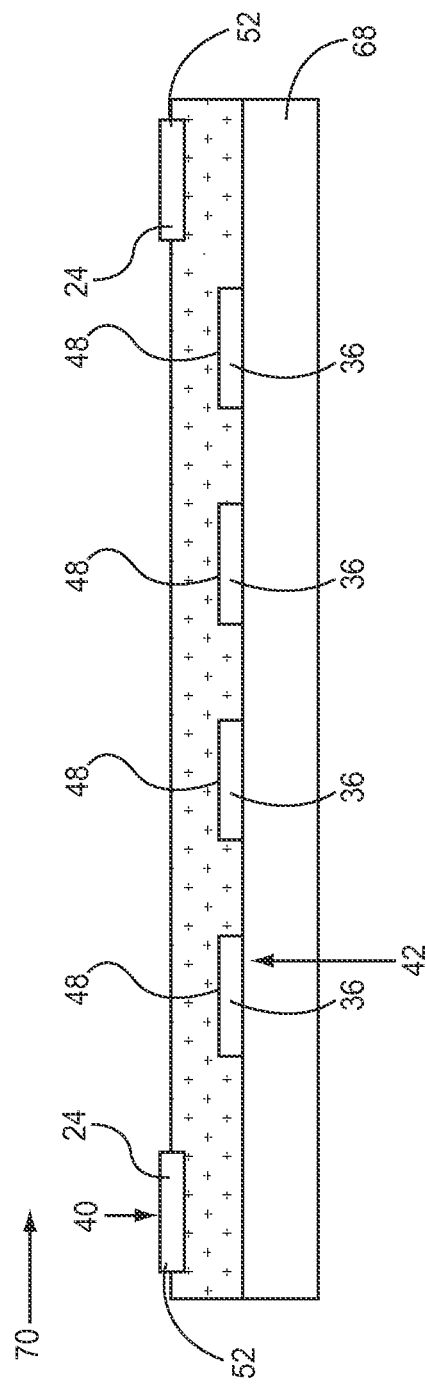

By controlling the depth of the cut, the opening 70 does not expose the sections 48 of signal leads 36 even though the sections 48 of the signal leads 36 are positioned directly below the opening 70 relative to the first side 40 of the metallic lead frame 12. However, as shown in FIG. 3J, at least a section of the grounding portions 52 are exposed through the opening 70. If desired, these grounding portions 52 may now be spot plated with a noble metal, such as gold (Au) or silver (Ag). In other embodiments, the entire metallic lead frame 12 may be plated with a noble metal prior to the application of the overmold 20.

Figure 3K:
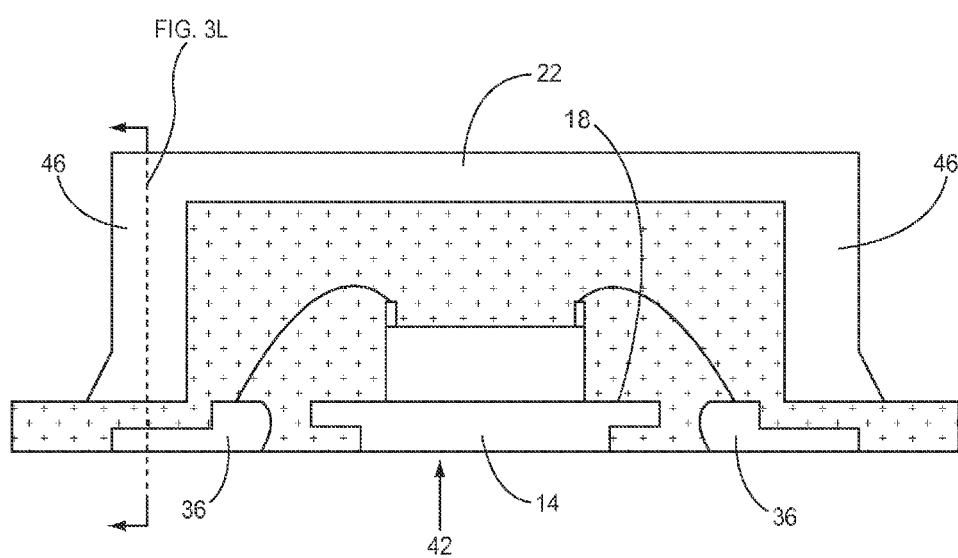

Next, an electromagnetic shield material is then applied over the overmold 20 and in the opening 70 to form the electromagnetic shield 22 over the component area 18 (FIG. 3K). For example, the electromagnetic shield material may be electroplated to the outside surface of the overmold 20 and within the opening 70. The electromagnetic shield material may be any type of conductive material, such as Copper (Cu), Aluminum (Au), gold (Au), silver (Ag), or the like. Depending on the requirements of the electronic package 10, in alternative embodiments, the grounding portions 52 may be entirely removed or segmented off the metallic structure 24 by the grinding process. In this case, the tie bars 64 may form grounding elements that are exposed by the opening 70 and connect to the electromagnetic shield 22. It is also possible that the opening 70 exposes sections of both the grounding portions 52 and the tie bars 64 so that each form grounding elements for the electromagnetic shield 22.

Figure 3L:
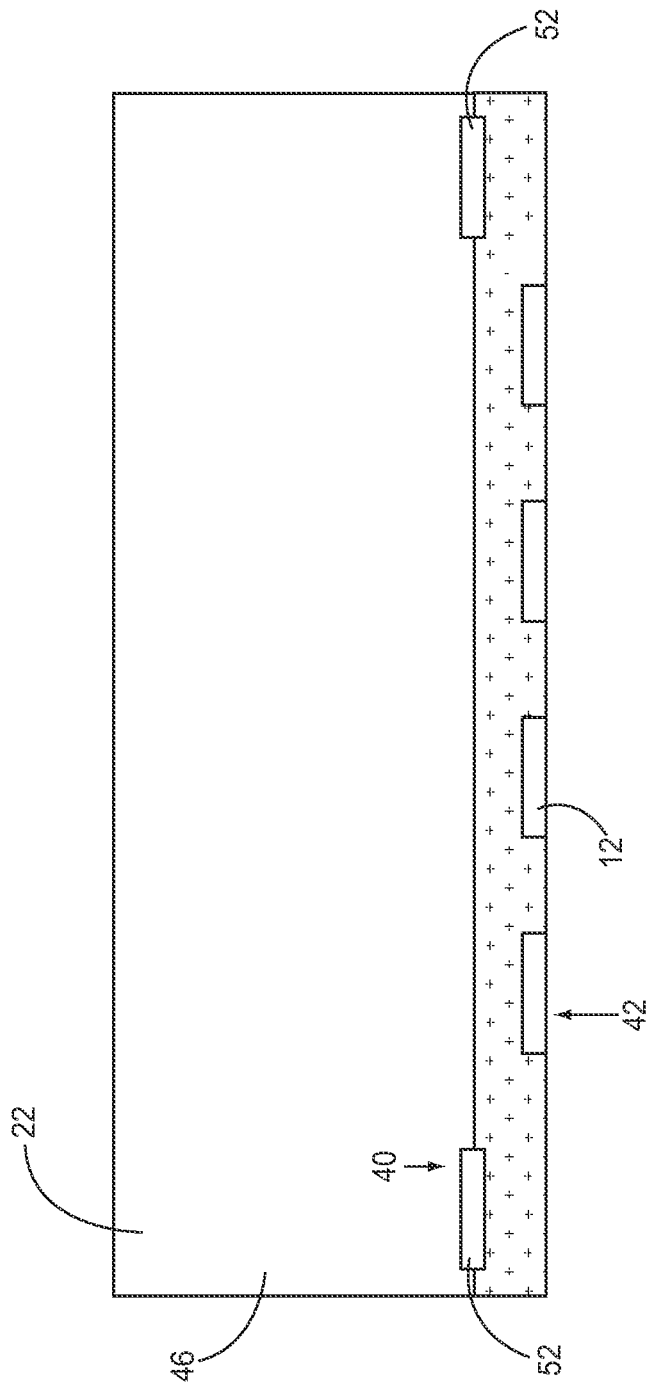

In illustrated embodiment of FIG. 3K, the electromagnetic shield 22 conforms to the shape of the overmold 20. As shown in FIG. 3L, the lateral portions 46 of electromagnetic shield 22 extend down onto the first side 40 of the metallic lead frame 12 so that the electromagnetic shield 22 is coupled to grounding portions 52 and can connect to ground. The signal leads 36 remain unexposed from the overmold 20 relative to the first side 40 of the metallic lead frame 12 and thus are isolated from the electromagnetic shield 22. However, the bottom of the signal leads 36 may be exposed from the overmold 20 relative the second side 42 of the metallic lead frame 12 to provide external connections to the signal leads 36. Similarly, the unetched bottom of the component portion 14 (shown in FIG. 3K) may be exposed through the overmold 20 relative to the second side 42 of the metallic lead frame 12 to form an external connection to a common ground.

Figure 4A:
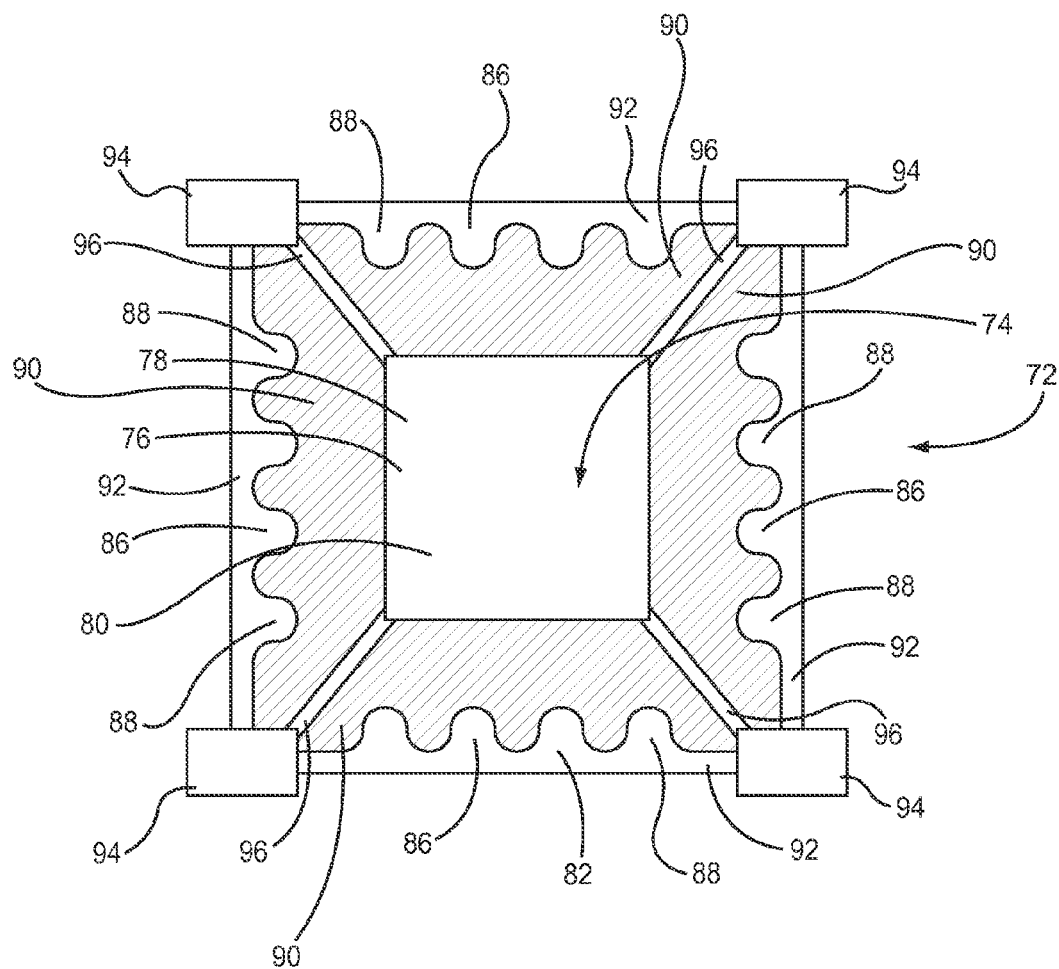
FIGS. 4A-4I illustrates one embodiment of steps for manufacturing another embodiment of the electronic package in accordance with the disclosure.

FIGS. 4A-4I illustrates steps for forming yet another embodiment of an electronic package. In FIG. 4A, a metallic lead frame 72 is provided. The metallic lead frame 72 is illustrated from a first side 74 of the metallic lead frame 72. As in the previous embodiment, a surface 76 on the first side 74 of the metallic lead frame 72 has a component area 78 on a component portion 80. Also, a metallic structure 82 extends about a periphery 84 of the component portion 80. Similar to the previous embodiment, the metallic structure 82 includes a plurality of connection portions 86 and extends about the entire periphery of the component portion 80. Each of the connection portions 86 include four (4) connection leads 88. As illustrated by FIG. 4A, gaps 90 separate the component portion 80 from the connection portions 86. To maintain the integrity of the component portions 86 prior to the application of an overmold, the connection leads 88 are each attached to a tie bar 92. These tie bars 92 may subsequently be removed or segmented depending on the connection requirements for the electronic package. As in the previous embodiment, the metallic structure 82 also has a plurality of grounding portions 94 for coupling an electromagnetic shield to ground.

Tie bars 96 may be provided to attach the metallic structure 82 to the component portion 80. These tie bars 96 also electrically couple these grounding portions 94 to the component portion 80. As in the previous embodiment, the component portion 80 may be configured to directly connect to ground when the electronic package is connected to external components. Thus, tie bars 96 may provide a path to ground for the grounding portions 94 through the component portion 80. In alternative embodiments, tie bars 96 may connect to other structures to provide a short to ground.

Figure 4B:
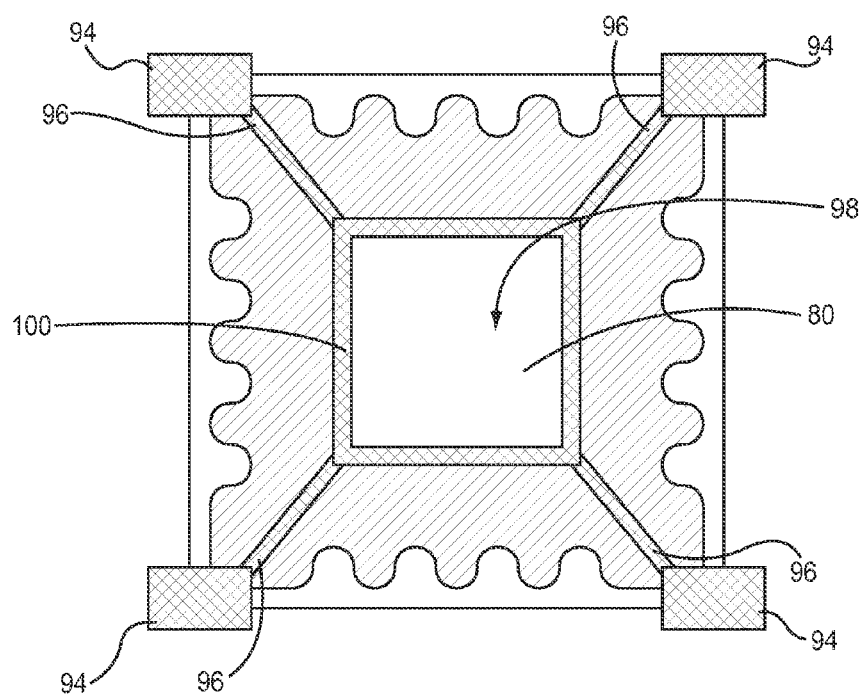
Figure 4C:
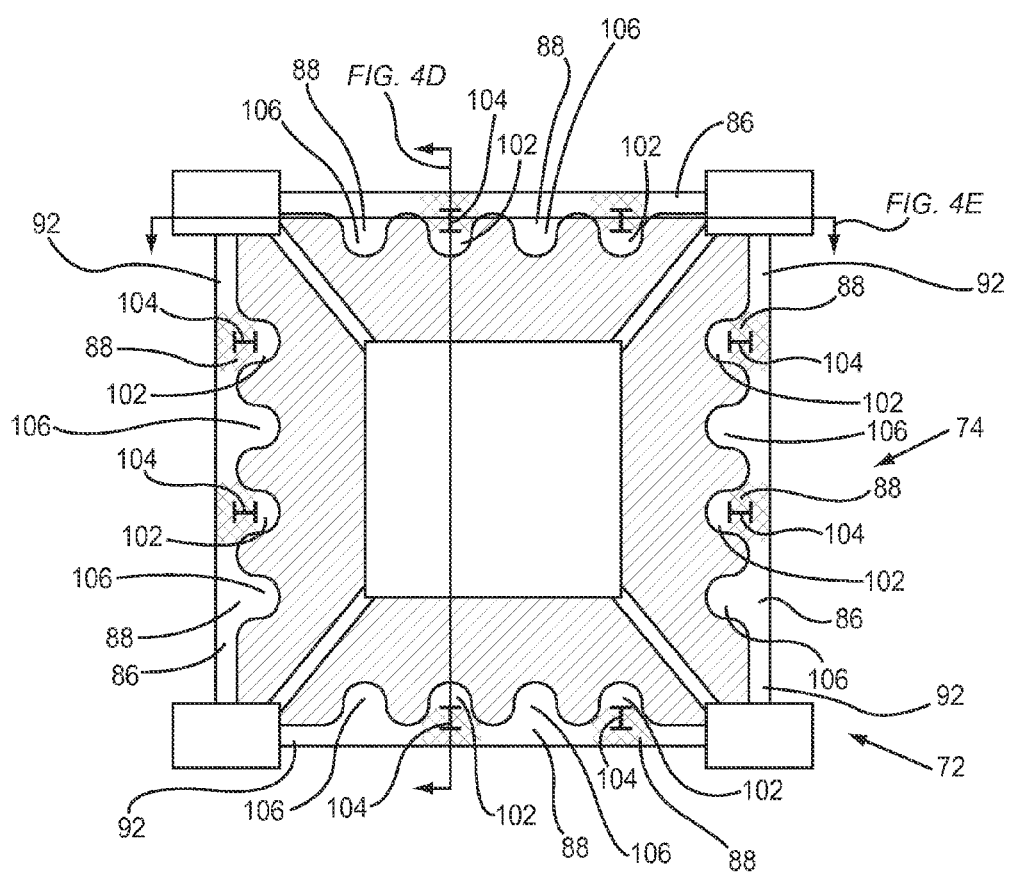

Next, as in the previous embodiment, a first partial etch is performed from a second side 98 of the metallic lead frame 72 oppositely disposed from the first side 74 (FIG. 4B). The first partial etch is performed on the grounding portions 94, sections 100 of the component portion 80, and the tie bars 96. Also, in this embodiment, a second partial etch is performed from the first side 74 of the metallic lead frame 72 on only some of the connection leads 88 of each of the connection portions 86 (FIG. 4C). The connection leads 88 that are etched by the second partial etch from the first side 74 form signal leads 102 for transmitting signals. The second partial etch etches sections 104 of the signal leads 102 (and part of tie bars 92) to assure that these sections 104 remain isolated from an electromagnetic shield. The connection leads 88 that are not etched by the second partial etch form grounding leads 106 for connecting to ground.

Figure 4D:
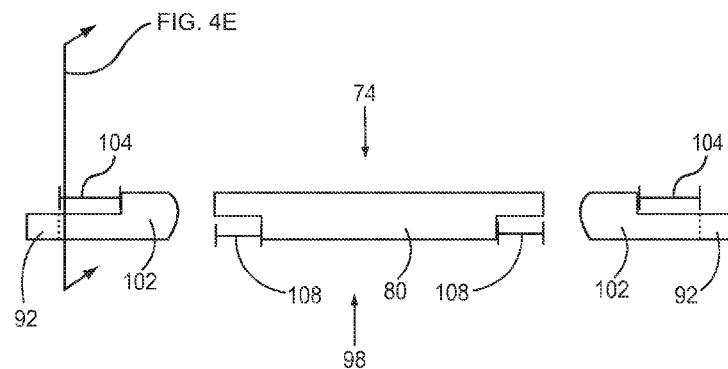
Figure 4E:
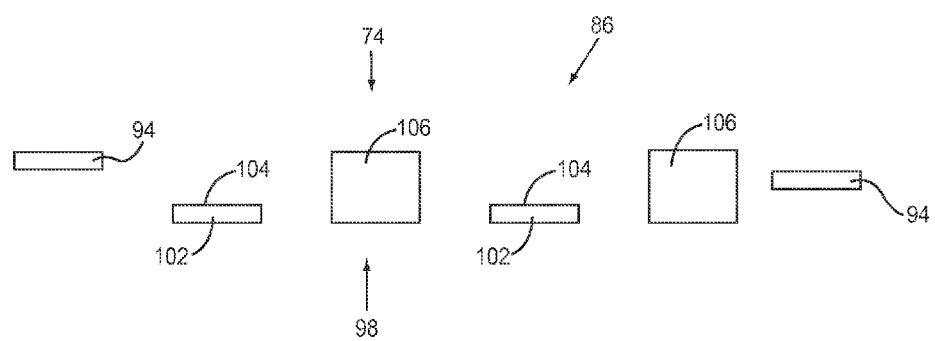

As illustrated in FIGS. 4D and 4E, the first partial etch forms sections 108 of the component portion 80 so that sections 108 are partially etched on the second side 98. The tie bars 96 (shown in 4B) are also partially etched on the second side 98. Similarly, the sections 104 of the signal leads 102 are partially etched relative on the first side 74. FIG. 4E illustrates a cross-sectional view of the signal leads 102 in one of the connection portions 86 of the metallic structure 82 along with the associated grounding portions 94. By providing the first partial etch and the second partial etch, sections 104 of the signal leads 102 and the grounding portions 94 are on different vertical levels relative to the first side 74 and second side 98. Also, the grounding leads 106 extend from the first side 74 to the second side 98 of the metallic lead frame 72. In this manner, when the electromagnetic shield is formed, the electromagnetic shield may couple to the grounding portions 94 and grounding leads 106 for connecting to ground while remaining isolated from the signal leads 102. In alternative embodiments, the metallic structure 82 may not include grounding portions 94 so that the electromagnetic shield forms ground connections exclusively through grounding leads 106.

Figure 4F:
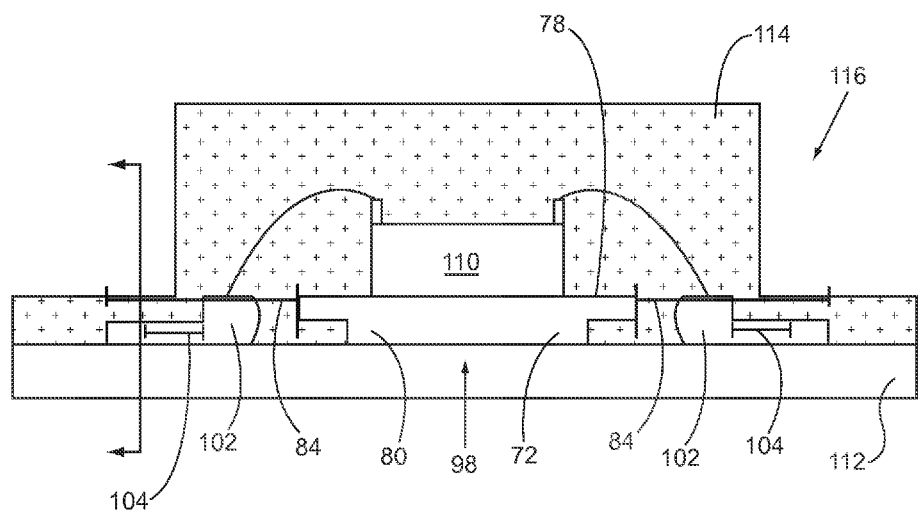

Next, steps similar to those discussed above for FIGS. 3F-3I may be performed to provide a wire bonded electronic component 110 attached to the component area 78, a protective covering 112 for protecting the second side 98 from the electromagnetic shield material, and an overmold 114 that covers the component area 78 which has an opening 116 about the periphery 84 of the component portion 80 (FIG. 4F).

Figure 4G:
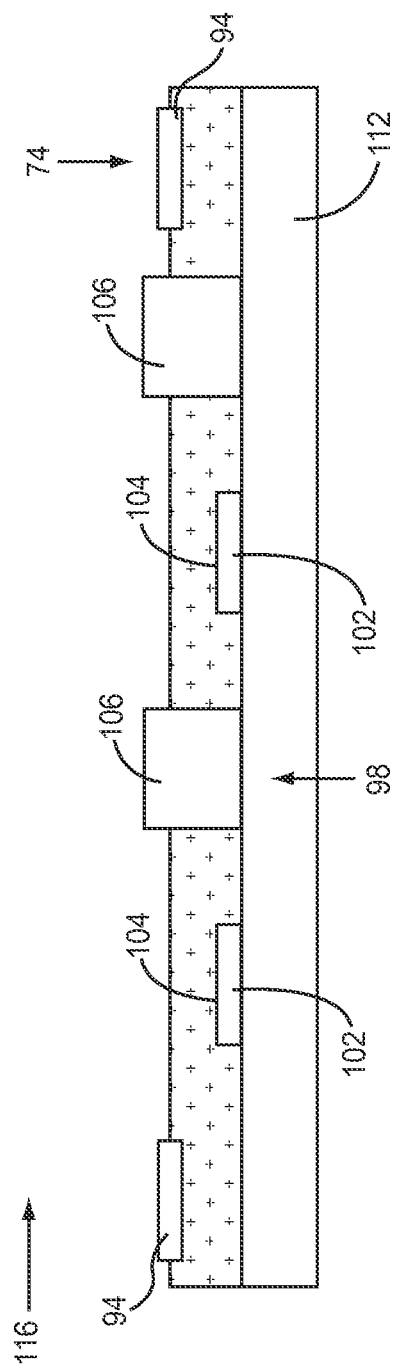
Figure 4H:
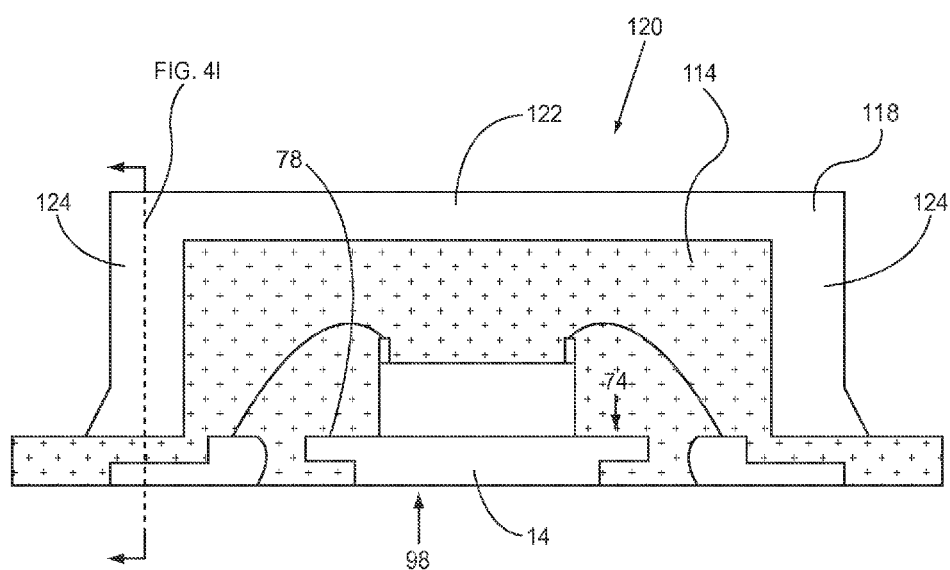

The opening 116 does not expose the sections 104 of signal leads 102 even though the sections 104 of the signal leads 102 are positioned directly below the opening 116 relative to the first side 74 of the metallic lead frame 72. However, as shown in FIG. 4G, the grounding portions 94 and grounding leads 106 are exposed through the opening 116. An electromagnetic shield material is then applied over the overmold 114 and in the opening 116 to form an electromagnetic shield 118 over the component area 78 (FIG. 4H). Also, the protective covering 112 has been removed. The electromagnetic shield 120 may have a top portion 122 over the component area 78 and lateral portions 124.

Figure 4I:
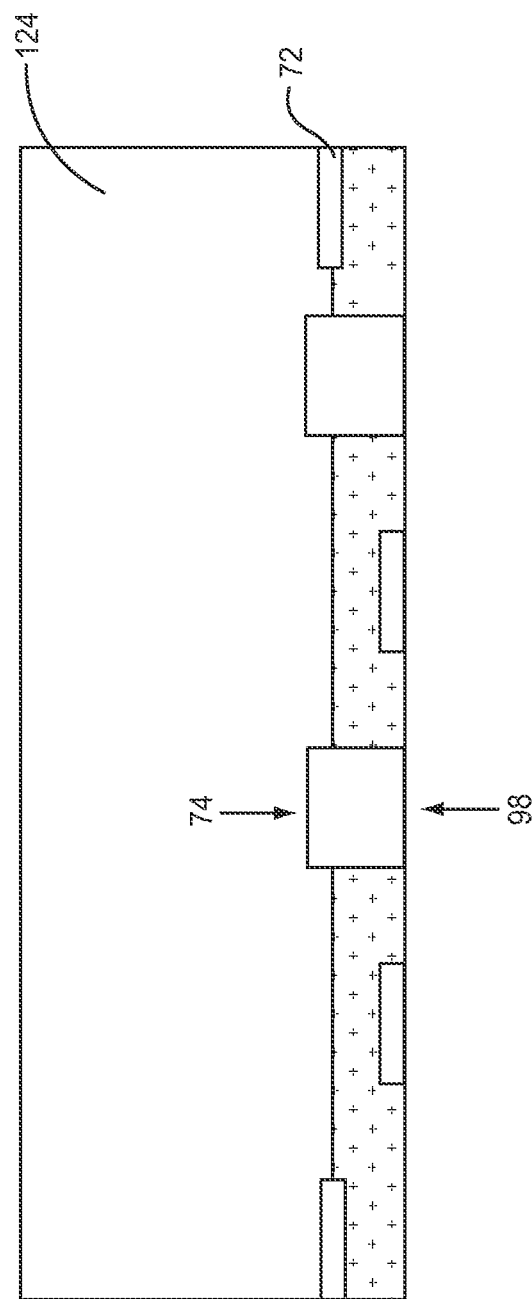

As shown in FIG. 4I, the lateral portions 124 of electromagnetic shield 118 extend down onto the first side 74 of the metallic lead frame 72 so that the electromagnetic shield 118 couples to grounding portions 52 for connecting to ground. The signal leads 102 remain unexposed from the overmold 114 relative to the first side 74 of the metallic lead frame 72 and thus are isolated from the electromagnetic shield 118. However, the bottom of the signal leads 102 may be exposed from the overmold 114 relative the second side 98 of the metallic lead frame 72 to expose external connections. Similarly, the unetched bottom of the component portion 80 and the grounding leads 106 (shown in FIG. 4G) may be exposed through the overmold 114 relative to the second side 98 of the metallic lead frame 72 to form an external connection to a common ground, such as a ground on a printed circuit board or chassis.

Figure 5A:
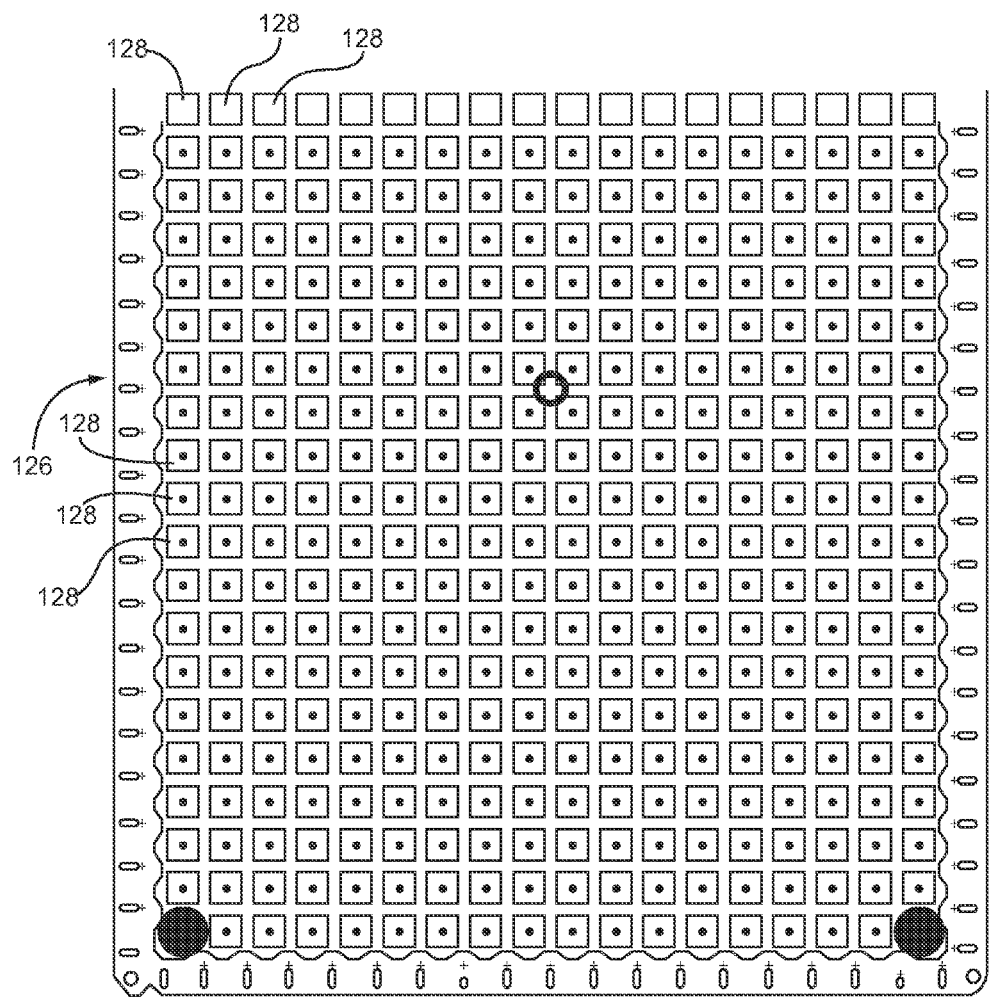
FIGS. 5A-5L illustrates one embodiment of steps for manufacturing a plurality of electronic packages from a common metallic lead frame.

FIGS. 5A-5L illustrates steps for manufacturing a plurality of electronic packages on a common metallic lead frame 126. An embodiment of the common metallic lead frame 126 is shown in FIG. 5A. The common metallic lead frame 126 has a plurality of component portions 128 and may be of any length and width depending on the number of electronic packages to be formed on the common metallic lead frame 126. The component portions 128 may be arranged on the common metallic lead frame 126 in rows and columns. The thickness of the common metallic lead frame 126 may be around 100-254 microns.

Figure 5B:
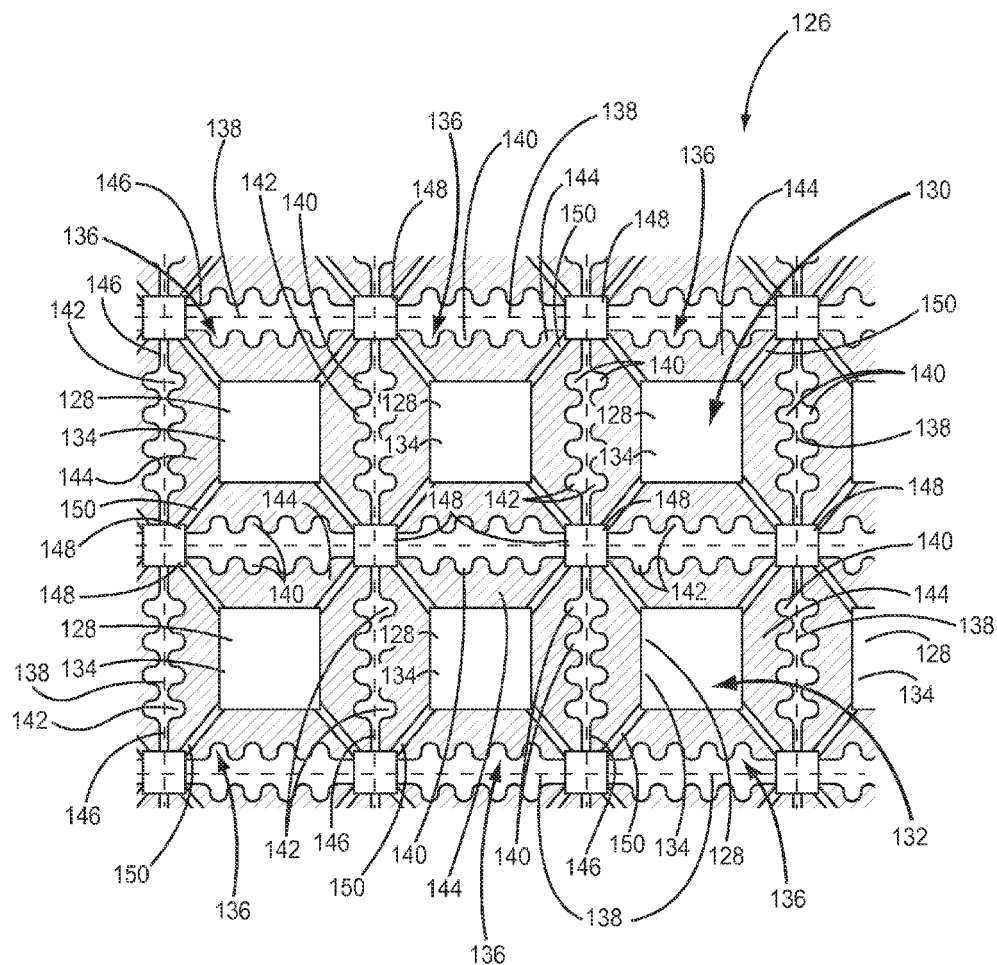

In FIG. 5B, the common metallic lead frame 126 is provided. The close-up of the common metallic lead frame 126 is illustrated from the first side 130 of the common metallic lead frame 126. A surface 132 on the first side 130 of the common metallic lead frame 126 has a plurality of component areas 134 defined by each of the component portions 128. The common metallic lead frame 126 also has a plurality of metallic structures 136 which each extend about a periphery 138 of one of the component portions 128. In this embodiment, the metallic structures 136 extend about the entire periphery 138 of one of the component portions 128 but in alternative embodiments, the metallic structures 136 may extend along only a portion of the peripheries 138.

The metallic structures 136 may have a plurality of connection portions 140. In this example, each of the connection portions 140 include four (4) connection leads 142 that are to be formed into signal leads for transmitting signals. Alternatively, as in the embodiment discussed above in FIGS. 4A-4I, the connection leads 142 may also be utilized to form ground leads. Gaps 144 separate the component portions 128 from the connection portions 140. To maintain the integrity of the component portions 128 prior to the application of an overmold, the connection leads 142 are each attached to a tie bar 146. These tie bars 146 may subsequently be removed or segmented depending on the requirements of the electronic packages. Initially, the metallic structures 136 may be integrally connected to one another in the common metallic lead frame 126. As explained in further detail below, after singulation of the electronic packages formed on the common metallic lead frame 126, the metallic structures 136 and component portions 128 may be separated from one another to provide individual metallic lead frames 126 for the singulated electronic packages. Also, it should be noted that the metallic structures 136 may not fully surround the periphery 138 of the component portions 128 when the tie bars 146 are removed since small gaps may be created between the connection leads 142 or other parts of the metallic structures 136. Thus, while not fully surrounding the periphery 138 of the component portions 128, the metallic structures 136 would still substantially surround the periphery 138 of one of the component portions 128.

In this embodiment, the metallic structures 136 also have a plurality of grounding portions 148 for coupling an electromagnetic shield to ground. Tie bars 150 may be provided to attach the metallic structures 136 to the component portions 128. These tie bars 150 also electrically couple the grounding portions 148 to the component portions 128. The component portions 128 may be configured to directly connect to ground when the electronic packages are connected to external components. Thus, tie bars 150 may provide a path to ground for the grounding portions 148 through the component portions 128. In alternative embodiments, grounding portions 158 or tie bars 150 may be connected to other components in the metallic structures 136, such as, for example, ground leads that provide the electromagnetic shield a path to ground.

Figure 5C:
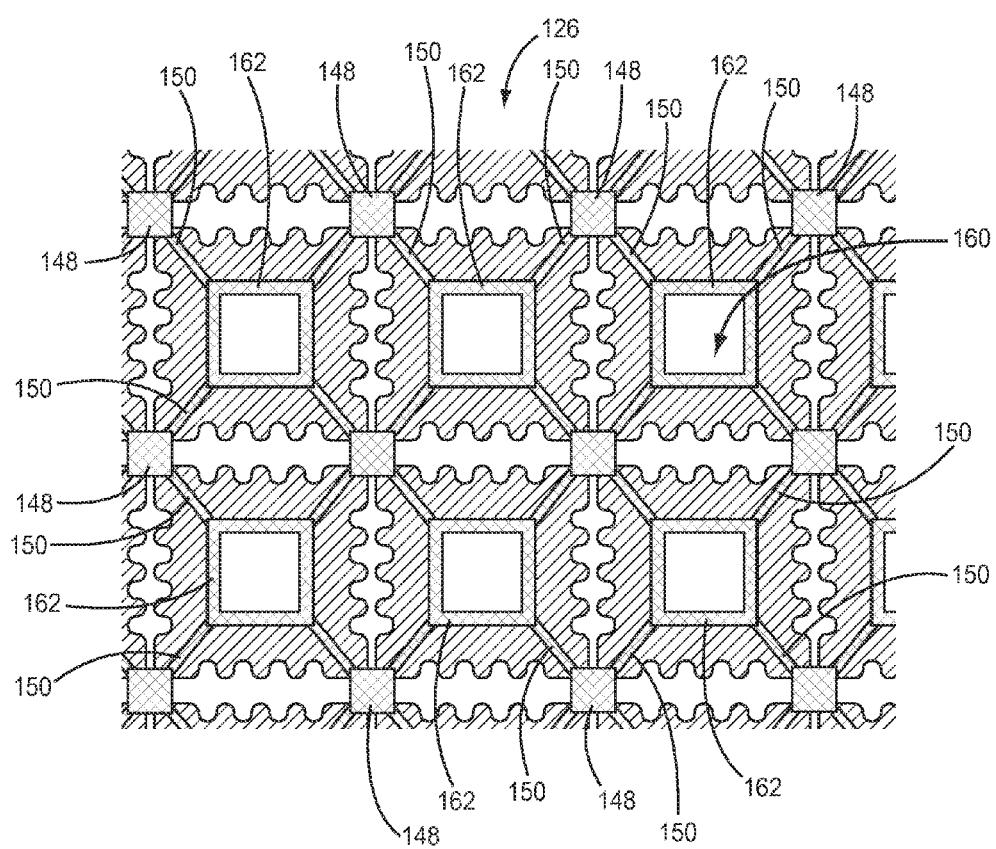
Figure 5D:
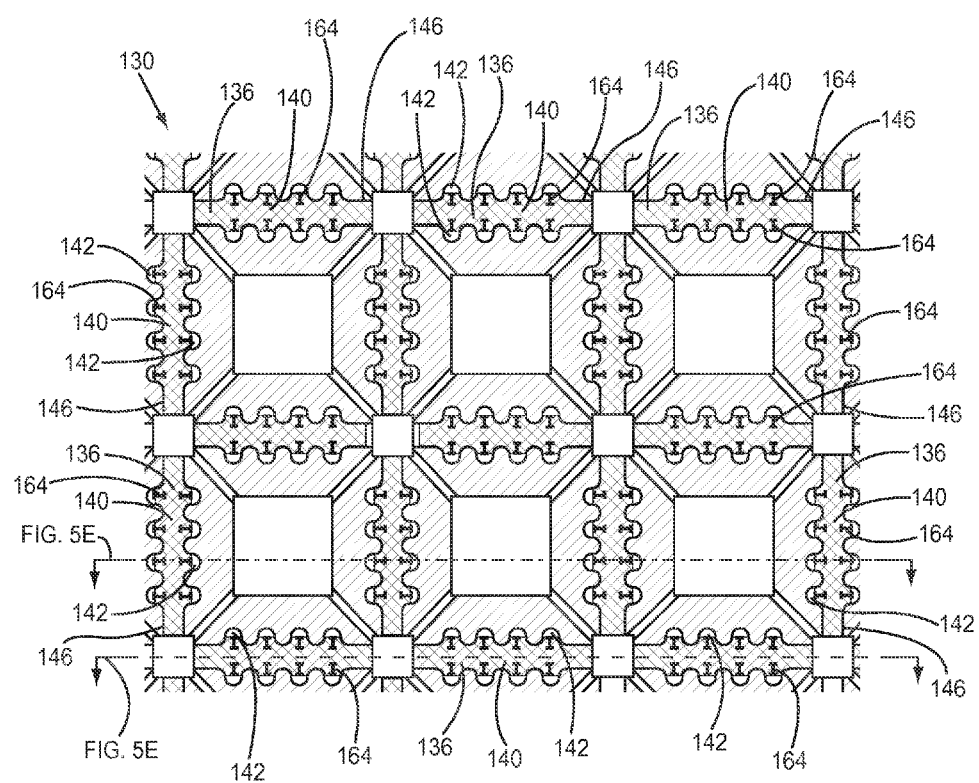

Next, a first partial etch is performed from a second side 160 of the common metallic lead frame 126 on the grounding portions 148, sections 162 of the component portions 128, and the tie bars 150 (FIG. 5C). A second partial etch is then performed on the connection portions 140 of the metallic structures 136 from the first side 130 of the common metallic lead frame 126 (FIG. 5D). The second partial etch etches sections 164 of each of the connection leads 142 and tie bars 146. In alternative embodiments, the first partial etch may etch only a section of the grounding portions 148 and/or the second partial etch may partially etch the entirety of the connection leads 142 from the first side 130, as discussed above for in FIGS. 4C-4E. Also, there is no requirement that the first and second partial etches be performed in any particular order.

Figure 5E:
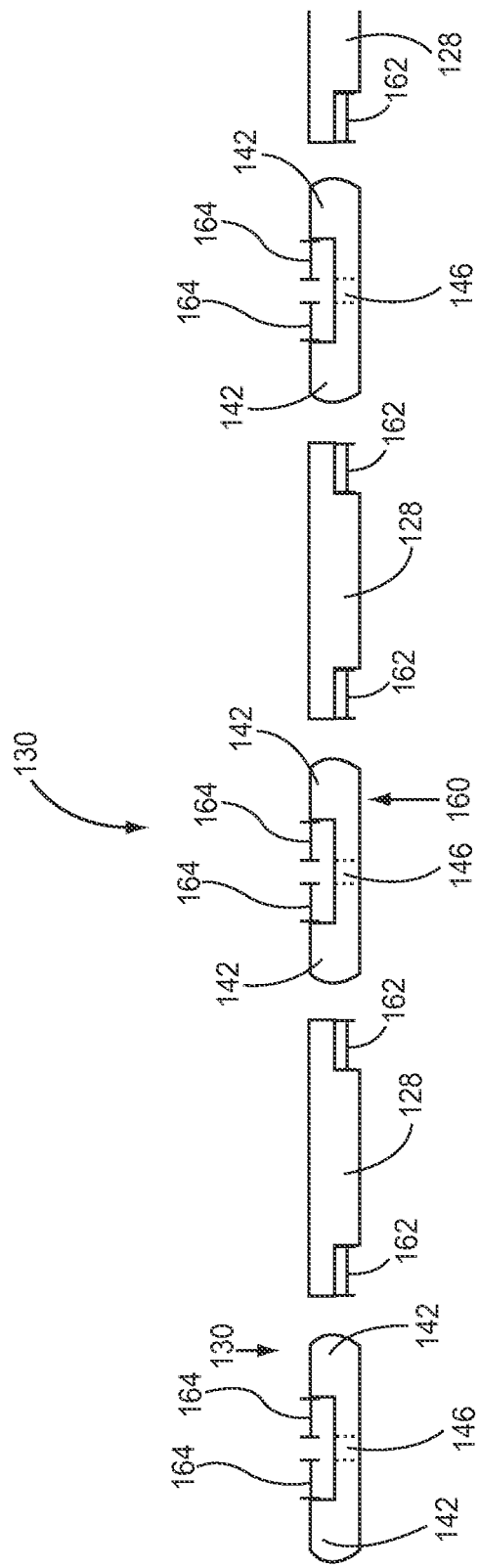
Figure 5F:
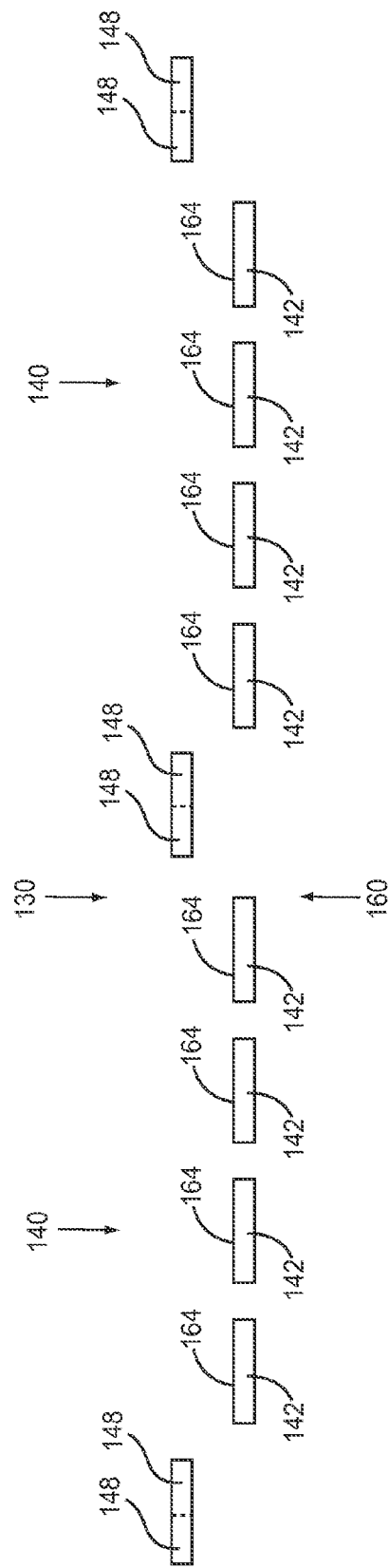

As illustrated in FIGS. 5E and 5F, the first partial etch forms sections 162 of the component portions 128 so that sections 162 are partially etched relative to the second side 160. The tie bars 150 (shown in 5C) are also partially etched relative to the second side 160. Similarly, the sections 164 of the connection leads 142 and tie bars 146 are partially etched relative to the first side 130. FIG. 5F illustrates a cross-sectional view of a row in the common metallic lead frame 126 showing the connection portions 140 along with the associated grounding portions 148. By providing the first partial etch and the second partial etch, sections 164 of the connection leads 142 and the grounding portions 148 are on different vertical levels relative to the first side 130 and the second side 160. As mentioned above, in this embodiment, the connection leads 142 are all formed into signal leads for transmitting signals. In this manner, the electromagnetic shields may couple to the grounding portions 148 associated with the component portion 128 while remaining isolated from the connection leads 142 when the electromagnetic shields are formed over the component portions 128.

Figure 5G:
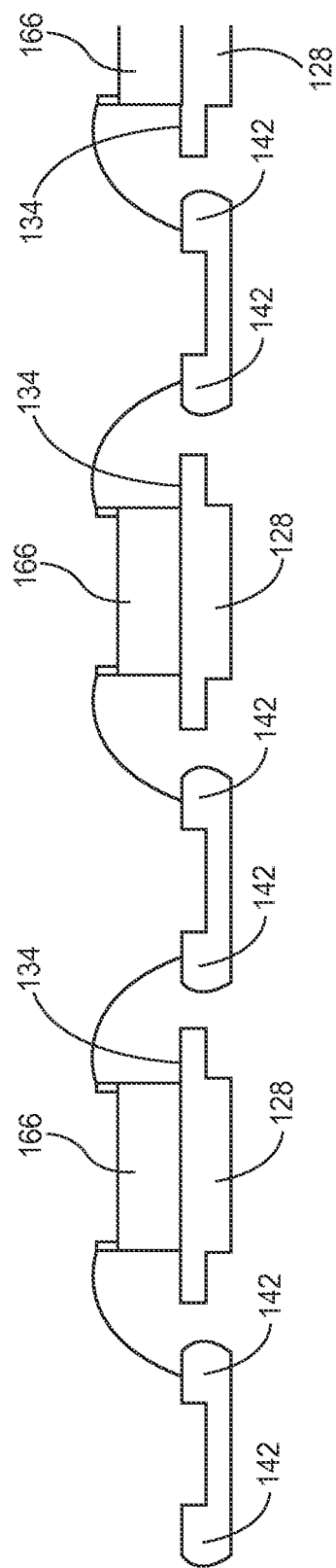
Figure 5H:
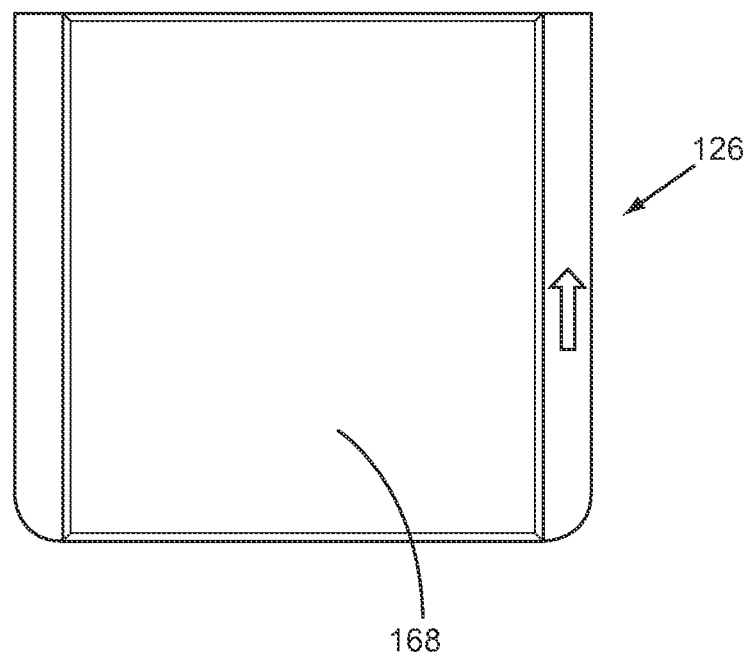
Figure 5I:
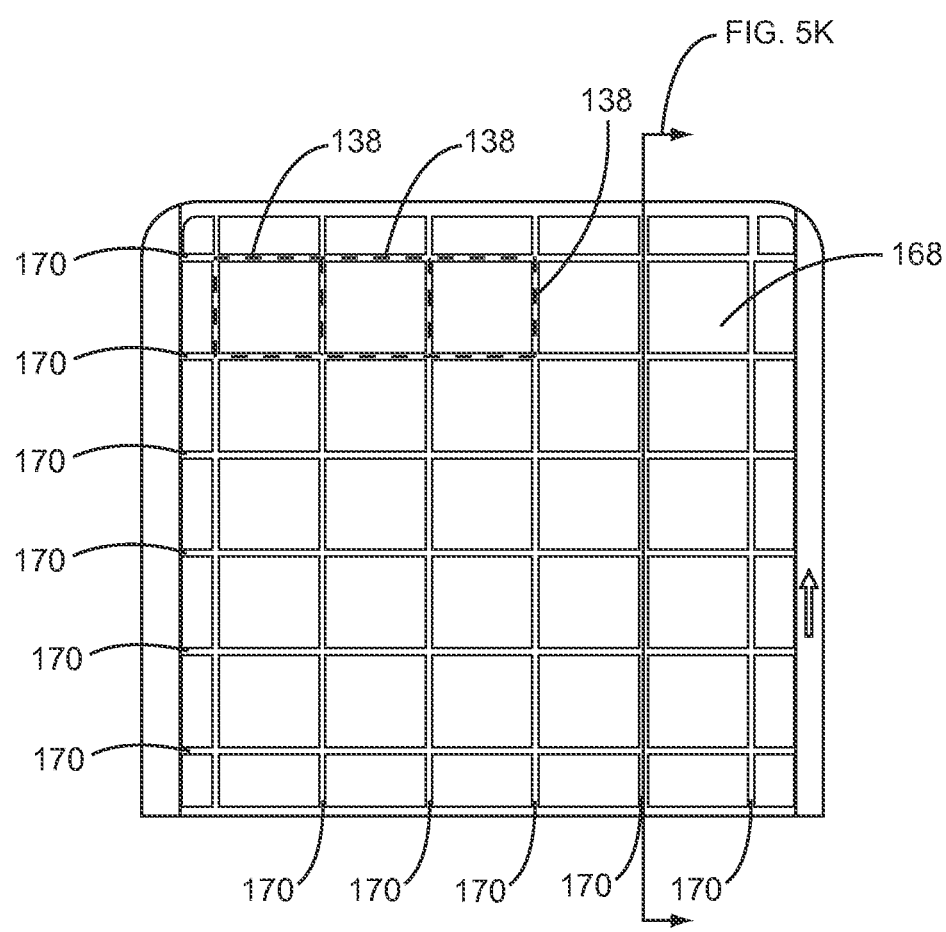

Electronic components 166 may then be attached to the component areas 134 of the component portions 128 and then wire bonded to connection leads 142 (FIG. 5G). The electronic components 166 and an overmold 168 is applied within and over the common metallic lead frame 126 to cover the component areas 134 (FIG. 5H). Prior to forming the electromagnetic shield over the component areas 134, a protective covering (not shown) may be provided to protect the second side 160 from the electromagnetic shield material. The protective covering may for example be made from tape, or the like. Channels 170 may then be formed through the overmold 168 about the periphery 138 of the component portions 128 (FIG. 5I). The channels 170 may be formed by performing a cut into the overmold 168 utilizing a grinding process, or the like.

Figure 5J:
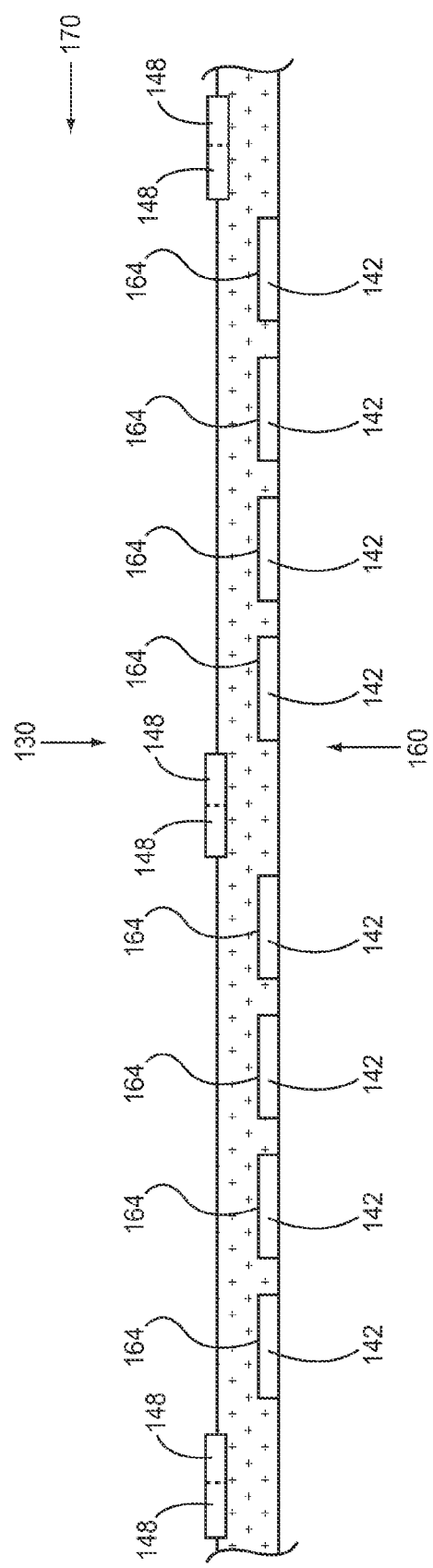
Figure 5K:
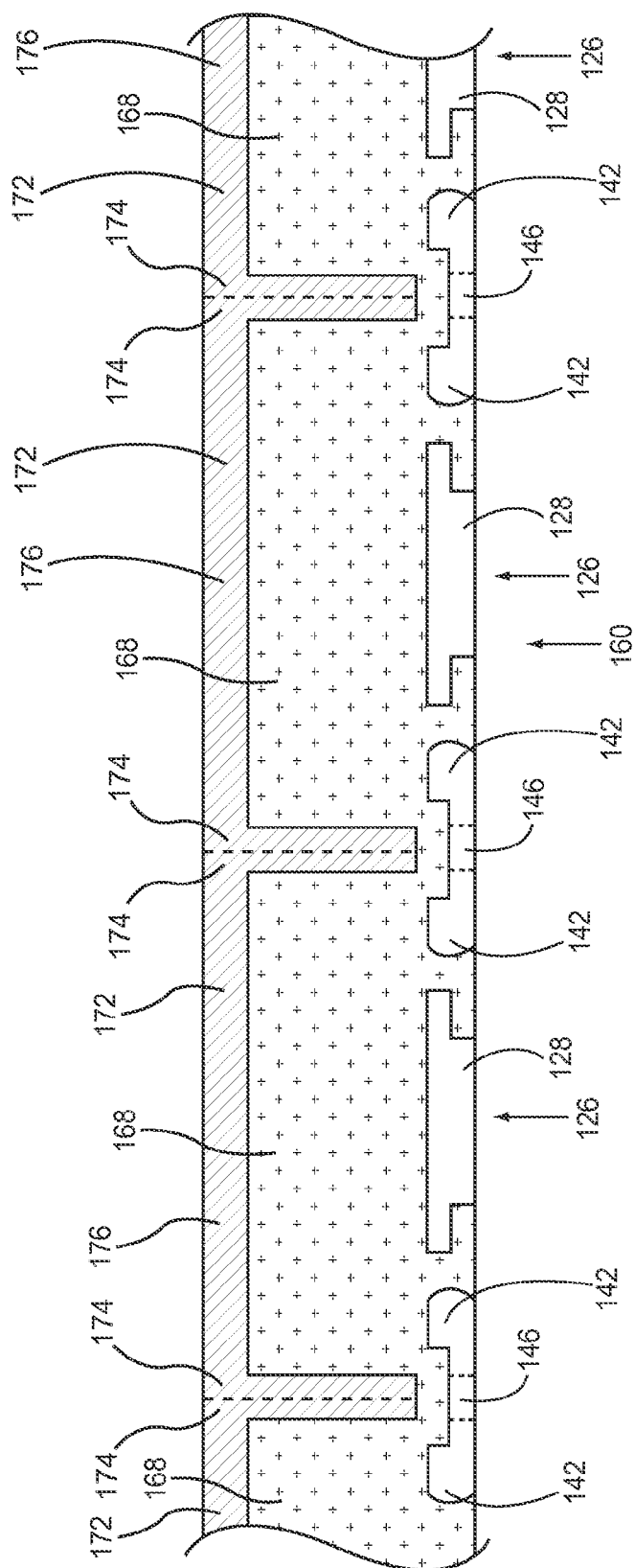

As illustrated in FIG. 5J, the channels 170 do not expose the sections 164 of connection leads 142 even though the sections 164 of the connection leads 142 are positioned directly below the channels 170 relative to the first side 130 of the common metallic lead frame 126. However, the grounding portions 148 of the metallic structures 136 are exposed through the channels 170. An electromagnetic shield material is then applied over the overmold 168 and in the channels 170 to form the electromagnetic shields 172 over each of the component areas 134 (FIG. 5K). In illustrated embodiment, the electromagnetic shields 172 conform to the shape of the overmold 168. Lateral portions 174 of each of the electromagnetic shields 172 extend down onto the first side 130 of the common metallic lead frame 126 so that the electromagnetic shields 172 are coupled to grounding portions 148 (shown in FIG. 5J) and can connect to ground. However, the connection leads 142 remain unexposed from the overmold 168 relative to the first side 130 of the common metallic lead frame 126 and thus are isolated from the electromagnetic shields 172. The bottom of the connection leads 142 may be exposed from the overmold 168 relative the second side 160 of the common metallic lead frame 126 provides external connections to the connection leads 142. Similarly, the unetched bottom of the component portions 128 may be exposed through the overmold 168 relative to the second side 160 of the common metallic lead frame 126 to form an external connection to a common ground.

Figure 5L:
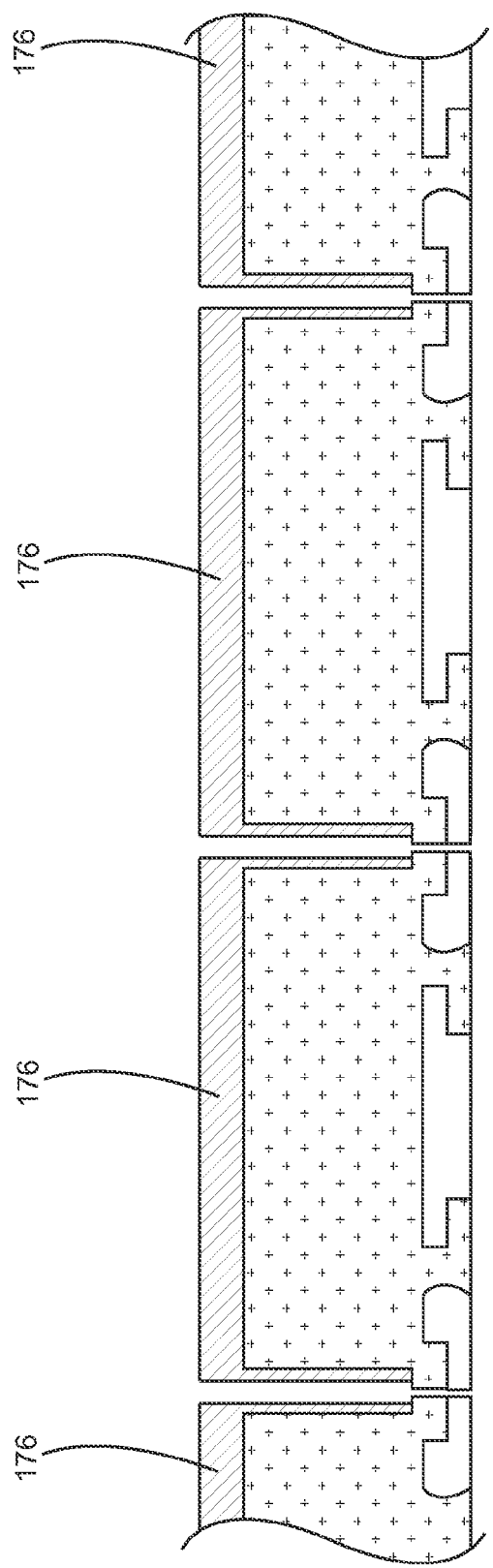

At this point, shielded electronic packages 176 have been formed but are integrally attached and thus are unsingulated. Consequently, the tie bars 146 couple the connection leads 142 of adjacent electronic packages 176 to one another. Similarly, grounding portions 148 (shown in FIG. 5C) and electromagnetic shields 172 for adjacent electronic packages 176 are integrally attached to one another. To form individualized electronic packages 176, a final cut is made to singulate the electronic packages 176 (FIG. 5L).

Figure 6:
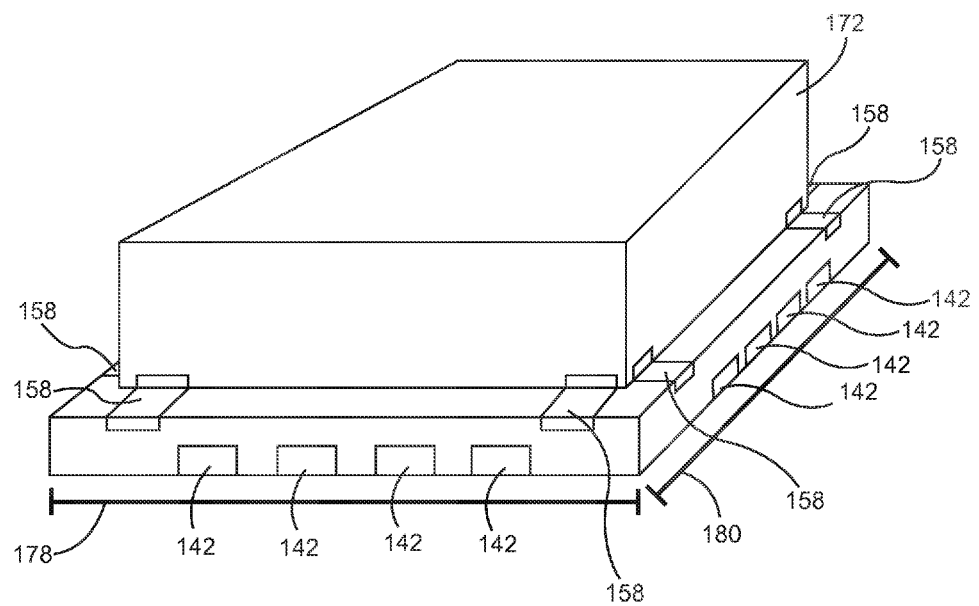
FIG. 6 is an embodiment of an electronic package that has been singulated from the plurality of electronic packages formed in accordance with the steps illustrated in FIGS. 5A-5L.

Referring now to FIG. 6, one of the singulated electronic packages 176 is shown. In this embodiment, the electromagnetic shield 172 attaches to grounding portions 158 while the connection leads 142 are isolated from the electromagnetic shield 172. Connection leads 142 however are exposed to provide external connections for transmitting signals to and/or from the electronic package 176. The electronic package 176 of this embodiment is rectangular.

However, electronic package 176 may be of any desired shape. The illustrated electronic package 176 may have a width 178 and a length 180 of less than around one inch and typically has a width 178 and a length 180 of a few millimeters. For example, the electronic package 176 may have the width 178 and length 180 of other standardized electronic packages, such as 3 mm×3 mm or 5 mm×5 mm.

Those skilled in the art will recognize improvements and modifications to the preferred embodiments of the present disclosure. All such improvements and modifications are considered within the scope of the concepts disclosed herein and the claims that follow.

What is claimed is:
1. A method of manufacturing an electronic package, comprising:
providing a metallic lead frame having a component area on a surface of the metallic lead frame and a metallic structure associated with the component area, wherein the metallic structure comprises a plurality of connection portions, each connection portion comprising a plurality of connection leads;
providing an electronic component on the component area;
providing an overmold within and over the metallic lead frame such that the overmold covers the component area;
forming an opening through the overmold that exposes at least a section of the metallic structure;

applying an electromagnetic shield material within the opening and over the overmold to form an electromagnetic shield over the component area such that the electromagnetic shield is coupled to at least the section of the metallic structure exposed by the opening;
coupling the metallic structure to ground with a grounding portion;
partially etching the grounding portion through a first etch; and
partially etching the metallic lead frame on a subset of the plurality of connection leads such that remaining ones of the plurality of connection leads other than the subset form grounding leads different from the grounding portion for connection to ground with a second etch.

2. The method of claim 1, further comprising:
wherein forming the opening through the overmold that exposes at least the section of the metallic structure includes exposing at least a section of the grounding portion; and
wherein applying the electromagnetic shield material within the opening and over the overmold to form the electromagnetic shield over the component area includes forming the electromagnetic shield such that the electromagnetic shield is coupled to at least the section of the grounding portion.

3. The method of claim 1, wherein:
forming the opening through the overmold that exposes at least the section of the metallic structure comprises forming the opening such that the section of the metallic structure exposed by the opening includes at least a section of the grounding portion; and
applying the electromagnetic shield material within the opening and over the overmold to form the electromagnetic shield over the component area such that the electromagnetic shield is coupled to at least the section of the metallic structure exposed by the opening includes forming the electromagnetic shield such that the electromagnetic shield is coupled to at least the section of the grounding portion exposed by the opening.

4. The method of claim 1, wherein the metallic structure includes a signal connection element for transmitting signals.

5. The method of claim 1, further comprising applying a noble metal to at least a section of the metallic lead frame.

6. The method of claim 1, wherein the metallic lead frame has a component portion that includes the component area on the surface of the metallic lead frame and the metallic structure associated with the component area extends along a periphery of the component portion.

7. The method of claim 6, wherein the metallic structure substantially surrounds the periphery of the component portion.

8. The method of claim 6, wherein providing the metallic lead frame having the component area on the surface of the metallic lead frame and the metallic structure associated with the component area comprises:
providing the metallic lead frame so as to include a first side and a second side oppositely disposed from the first side, the first side having the component area on the surface of the metallic lead frame; and
wherein the first etch comprises performing a first partial etch on the grounding portion from the second side of the metallic lead frame.

9. The method of claim 8, wherein providing the metallic lead frame having the component area on the surface of the metallic lead frame and the metallic structure associated with the component area comprises:
providing the metallic lead frame such that the metallic structure further includes a signal lead for transmitting signals; and
wherein the second etch comprises performing a second partial etch on at least a section of the signal lead from the first side of the metallic lead frame such that at least the section of the signal lead is partially etched from the first side of the metallic lead frame.

10. The method of claim 6 wherein the metallic structure substantially surrounds the periphery of the component portion and each of the plurality of connection portions is positioned between one of a plurality of grounding portions and another one of the plurality of grounding portions.

11. A method of manufacturing a plurality of electronic packages, comprising:
providing a metallic lead frame having a plurality of component portions and a plurality of metallic structures wherein each of the plurality of metallic structures extends about a periphery of one of the plurality of component portions and each of the plurality of component portions defines a component area on a surface of the metallic lead frame;
providing electronic components on component areas;
providing an overmold within the metallic lead frame and over the surface of the metallic lead frame to cover the component areas;
forming channels through the overmold about the periphery of each of the plurality of component portions, wherein the channels expose at least a section of each of the plurality of metallic structures; and
applying an electromagnetic shield material over the overmold and in the channels to form electromagnetic shields wherein each electromagnetic shield is formed over the component area of one of the plurality of component portions and at least the section of each of the plurality of metallic structures is coupled to one of the electromagnetic shields.

12. The method of claim 11, wherein each of the plurality of metallic structures substantially surrounds one of the plurality of component portions.

13. The method of claim 11, wherein providing the metallic lead frame having the plurality of component portions and the plurality of metallic structures comprises:
providing the metallic lead frame so that the metallic lead frame includes a first side and a second side oppositely disposed from the first side, the first side having the component areas, each of the plurality of metallic structures having a grounding portion that is coupled to the metallic lead frame for connecting to ground; and
performing a first partial etch on the grounding portion of each of the plurality of metallic structures from the second side of the metallic lead frame such that the grounding portion of each of the plurality of metallic structures is partially etched on the second side of the metallic lead frame.

14. The method of claim 13, wherein providing the metallic lead frame having the plurality of component portions and the plurality of metallic structures further comprises:
providing the metallic lead frame such that each of the plurality of metallic structures includes a signal lead for transmitting signals; and
performing a second partial etch on at least a section of the signal lead of each of the plurality of metallic structures from the first side of the metallic lead frame such that at least the section of the signal lead of each of the plurality of metallic structures is partially etched on the first side of the metallic lead frame.

15. The method of claim 14, further comprising:
wherein forming the channels through the overmold that exposes at least the section of each of the plurality of metallic structures comprises forming the channels through the overmold from the first side of the metallic lead frame and about the periphery of each of the plurality of component portions such that at least a section of the grounding portion of each of the plurality of metallic structures is exposed by the channels from the first side of the metallic lead frame and at least the section of the signal lead of each of the plurality of metallic structures remains unexposed from the first side of the metallic lead frame; and
wherein applying the electromagnetic shield material over the overmold and in the channels to form the electromagnetic shields wherein each electromagnetic shield is formed over the component area of one of the plurality of component portions and at least the section of each of the plurality of metallic structures is coupled to one of the electromagnetic shields includes, for each of the plurality of metallic structures, coupling at least the section of the grounding portion that is exposed from the first side of the metallic lead frame by the channels to one of the electromagnetic shields, wherein at least the section of each of the plurality of metallic structures that is coupled to one of the electromagnetic shields comprises at least the section of the grounding portion exposed by the channels.

16. The method of claim 15, wherein at least the section of the signal lead of each of the plurality of metallic structures is positioned directly below the channels relative to the first side of the metallic lead frame.

17. The method of claim 15 wherein:
after applying the electromagnetic shield material over the overmold and in the channels to form the electromagnetic shields over the component areas of each of the plurality of component portions, a plurality of unsingulated electronic packages are formed on the metallic lead frame, wherein each of the plurality of unsingulated electronic packages comprises one of the plurality of component portions and one of the plurality of metallic structures, singulating the plurality of unsingulated electronic packages to provide singulated electronic packages.

18. The method of claim 11, further comprising:
wherein providing the metallic lead frame so as to include a first side and a second side oppositely disposed from the first side, the first side having the component areas, each of the plurality of metallic structures having a first connection lead that is groundable and each of the plurality of metallic structures having a second connection lead for transmitting signals; and
performing a first partial etch on the second connection lead of each of the plurality of metallic structures from the first side of the metallic lead frame such that at least a section of the second connection lead of each of the plurality of metallic structures is partially etched on the first side of the metallic lead frame and the first connection lead is unetched by the first partial etch.

19. The method of claim 18, further comprising:
wherein forming the channels through the overmold wherein the channels expose at least the section of each of the plurality of metallic structures comprises forming the channels through the overmold from the first side of the metallic lead frame and about the periphery of each of the plurality of component portions comprises forming the channels such that, for each of the plurality of metallic structures, the channels expose at least a section of the first connection lead from the first side of the metallic lead frame and at least the section of the second connection lead that was partially etched remains unexposed from the first side of the metallic lead frame; and
wherein applying the electromagnetic shield material over the overmold and in the channels to form the electromagnetic shields wherein each electromagnetic shield is formed over the component area of one of the plurality of component portions and at least the section of each of the plurality of metallic structures is coupled to one of the electromagnetic shields includes, for each of the plurality of metallic structures, coupling the one of the electromagnetic shields to at least the section of the first connection lead that is exposed from the first side of the metallic lead frame by the channels, wherein at least the section of each of the plurality of metallic structures comprises at least the section of the first connection lead.

* * * * *